US011968840B2

(12) United States Patent
Wu et al.

(10) Patent No.: US 11,968,840 B2
(45) Date of Patent: Apr. 23, 2024

(54) TRI-GATE TRANSISTOR AND METHODS FOR FORMING THE SAME

(71) Applicant: Taiwan Semiconductor Manufacturing Company Limited, Hsinchu (TW)

(72) Inventors: Yong-Jie Wu, Hsinchu (TW); Yen-Chung Ho, Hsinchu (TW); Hui-Hsien Wei, Taoyuan (TW); Chia-Jung Yu, Hsinchu (TW); Pin-Cheng Hsu, Zhubei (TW); Feng-Cheng Yang, ZhudongTownship (TW); Chung-Te Lin, Taiwan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 248 days.

(21) Appl. No.: 17/523,044

(22) Filed: Nov. 10, 2021

(65) Prior Publication Data
US 2022/0328501 A1 Oct. 13, 2022

Related U.S. Application Data

(60) Provisional application No. 63/173,119, filed on Apr. 9, 2021.

(51) Int. Cl.
*H10B 51/30* (2023.01)
*G11C 5/06* (2006.01)
(Continued)

(52) U.S. Cl.
CPC ............... *H10B 51/30* (2023.02); *G11C 5/06* (2013.01); *H01L 29/516* (2013.01);
(Continued)

(58) Field of Classification Search
CPC ......... H01L 29/41775; H01L 29/42356; H01L 29/516; H01L 29/6684; H01L 29/78618;
(Continued)

(56) References Cited

U.S. PATENT DOCUMENTS

2020/0006576 A1\* 1/2020 Ma .......................... H01L 29/775
2020/0098932 A1\* 3/2020 Lajoie ..................... H10B 12/33
(Continued)

FOREIGN PATENT DOCUMENTS

CN 114093927 A \* 2/2022
WO WO-2018125118 A1 \* 7/2018

*Primary Examiner* — Matthew E Warren
(74) *Attorney, Agent, or Firm* — The Marbury Law Group, PLLC

(57) ABSTRACT

A thin film transistor includes an active layer located over a substrate, a first gate stack including a stack of a first gate dielectric and a first gate electrode and located on a first surface of the active layer, a pair of first contact electrodes contacting peripheral portions of the first surface of the active layer and laterally spaced from each other along a first horizontal direction by the first gate electrode, a second contact electrode contacting a second surface of the active layer that is vertically spaced from the first surface of the active layer, and a pair of second gate stacks including a respective stack of a second gate dielectric and a second gate electrode and located on a respective peripheral portion of a second surface of the active layer.

20 Claims, 34 Drawing Sheets

(51) Int. Cl.
    *H01L 29/51*     (2006.01)
    *H01L 29/66*     (2006.01)
    *H01L 29/78*     (2006.01)
    *H01L 29/786*     (2006.01)
    *H10B 51/10*     (2023.01)

(52) U.S. Cl.
    CPC .... *H01L 29/6684* (2013.01); *H01L 29/78391* (2014.09); *H01L 29/78618* (2013.01); *H10B 51/10* (2023.02)

(58) Field of Classification Search
    CPC ... H01L 29/78391; H10B 51/10; H10B 51/30; H10B 51/40; G11C 5/06
    See application file for complete search history.

(56) References Cited

U.S. PATENT DOCUMENTS

| | | | | |
|---|---|---|---|---|
| 2020/0211905 | A1* | 7/2020 | Huang | H01L 27/092 |
| 2021/0036023 | A1* | 2/2021 | Agrawal | H01L 29/0847 |
| 2021/0083122 | A1* | 3/2021 | Naylor | H10B 41/27 |
| 2021/0408117 | A1* | 12/2021 | Wu | H01L 29/78645 |
| 2022/0359759 | A1* | 11/2022 | Ku | H01L 29/517 |
| 2022/0384656 | A1* | 12/2022 | Lee | H01L 21/02565 |
| 2023/0378369 | A1* | 11/2023 | Tsai | H01L 29/24 |

* cited by examiner

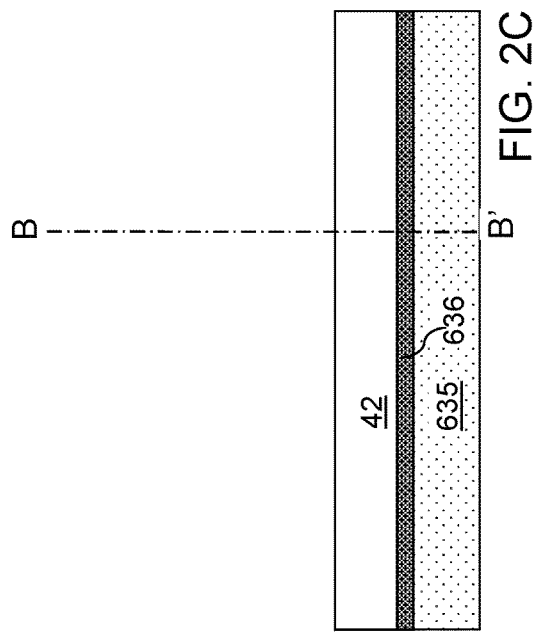
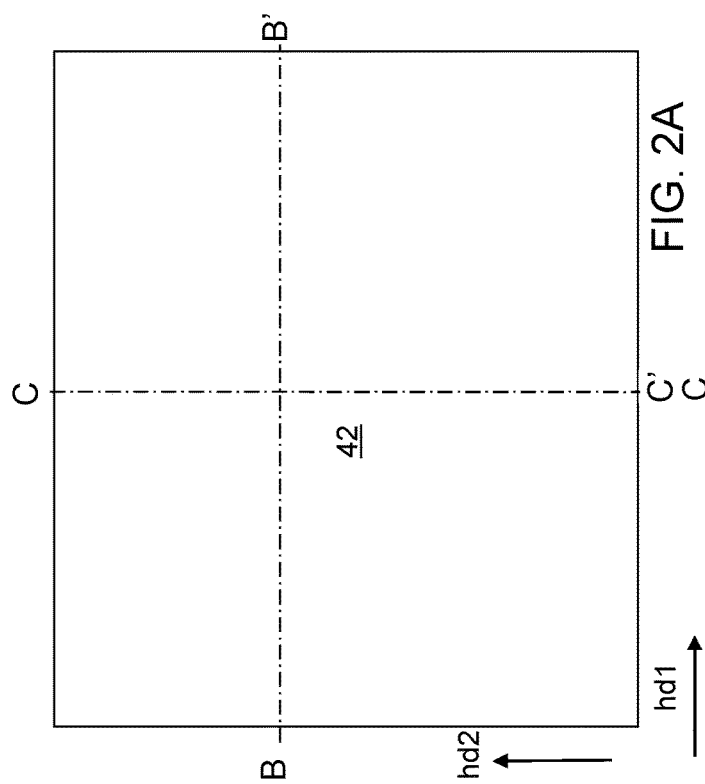
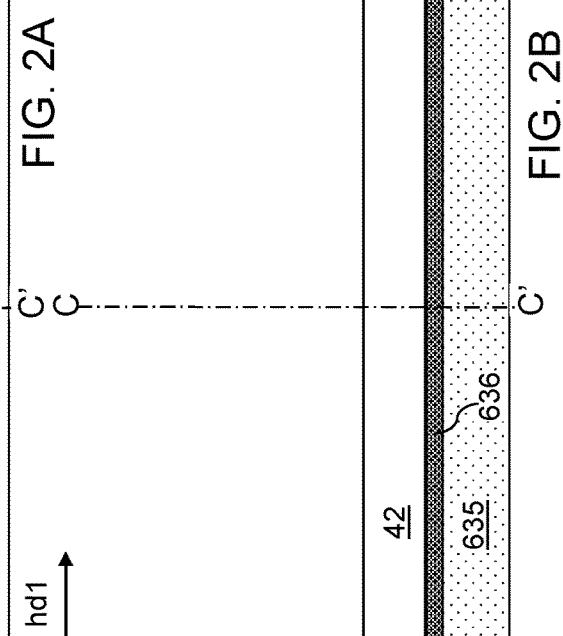

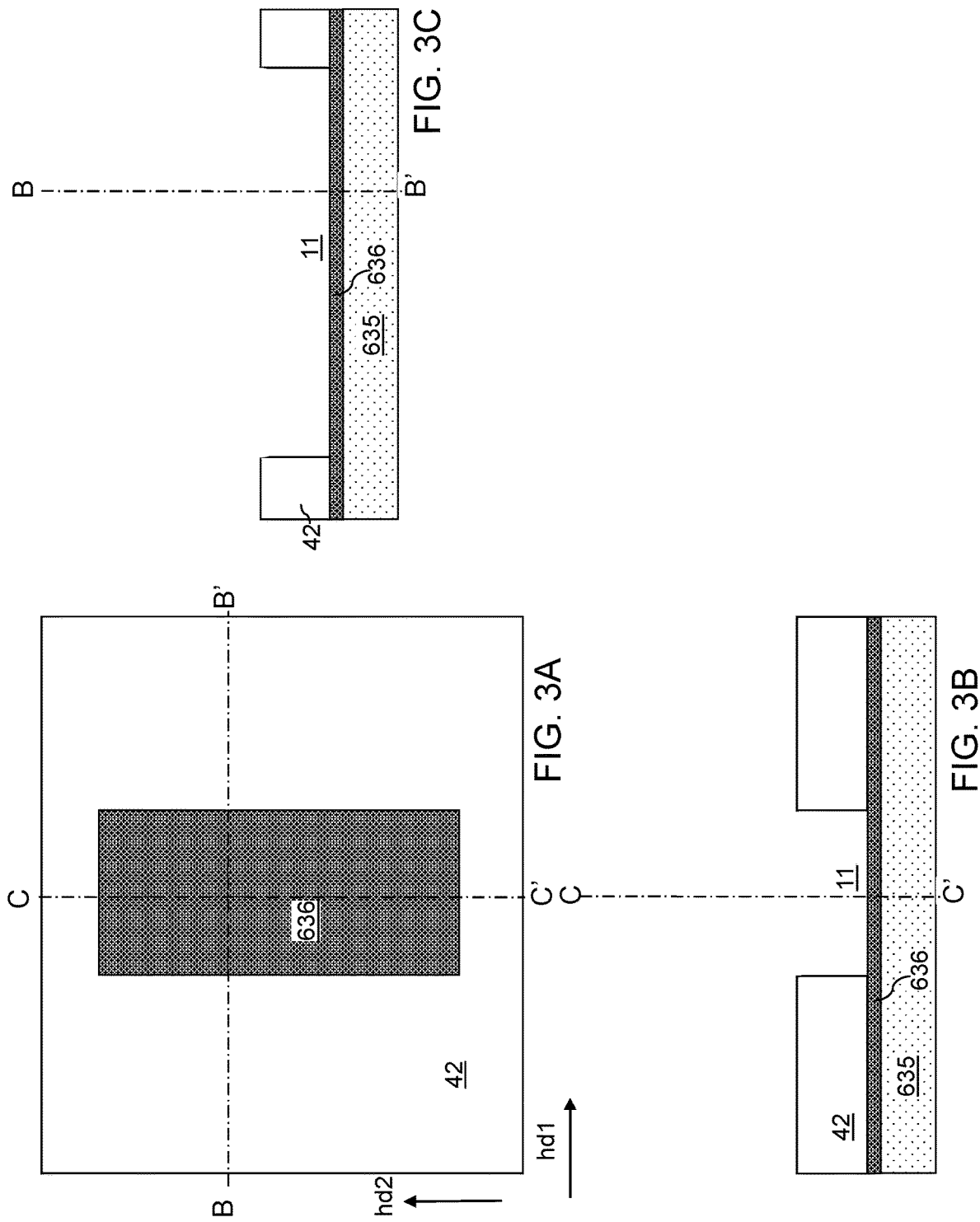

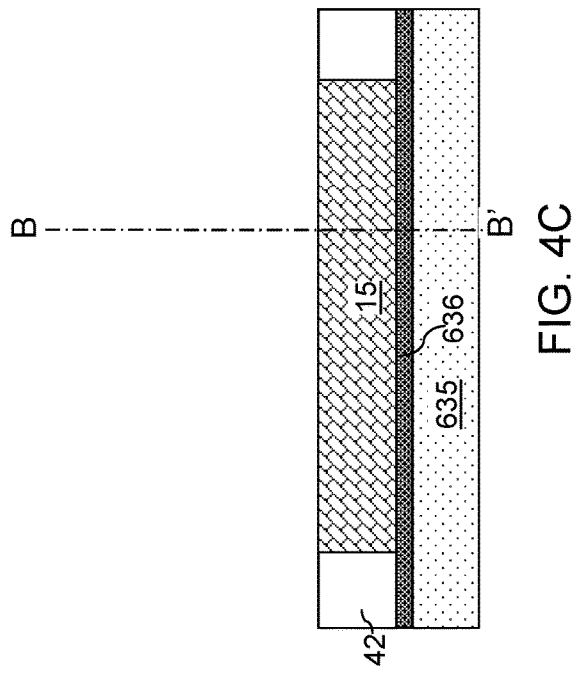
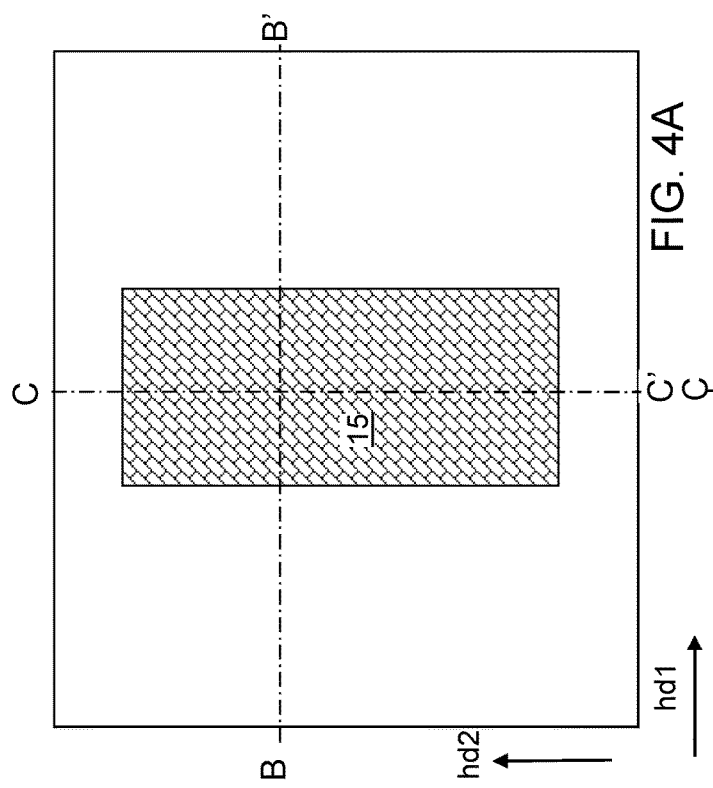
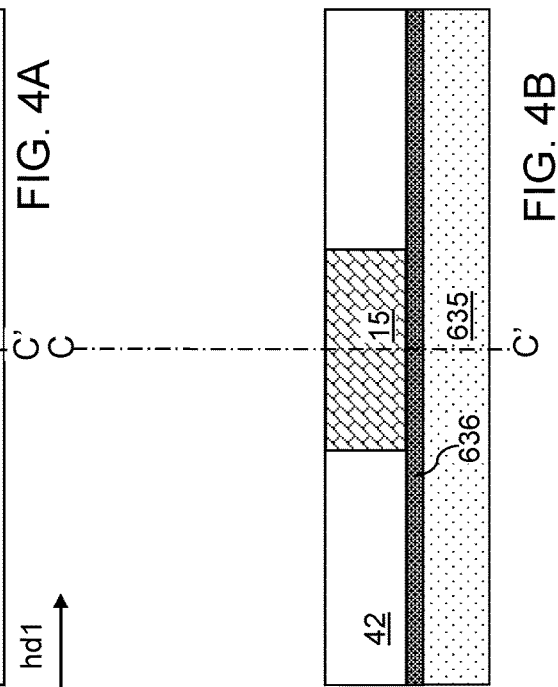

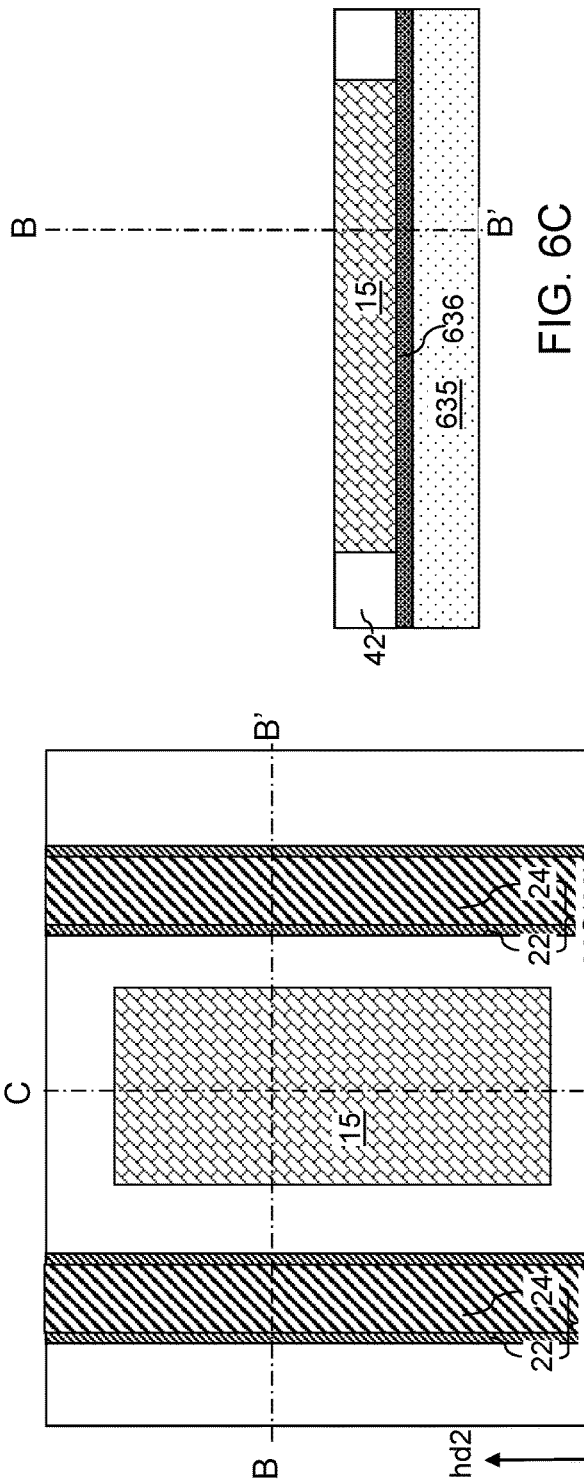

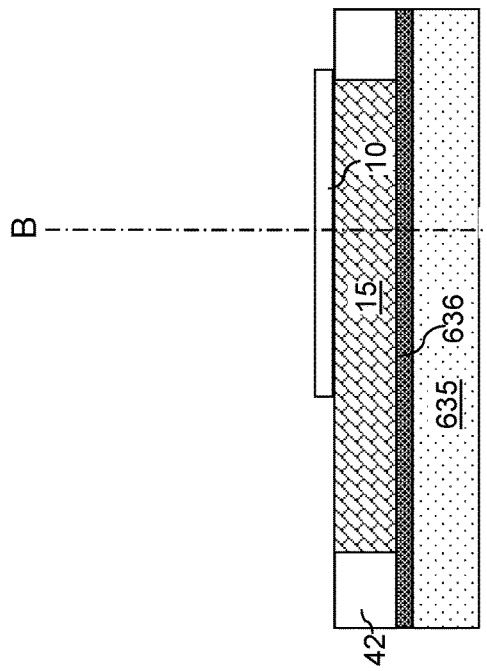
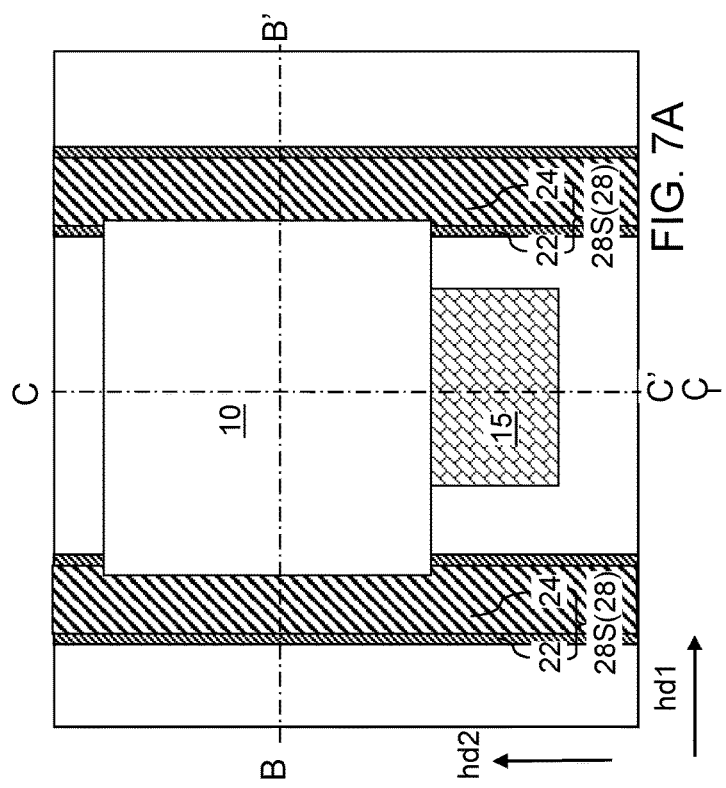
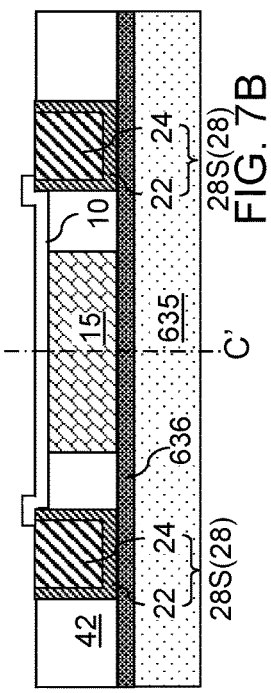

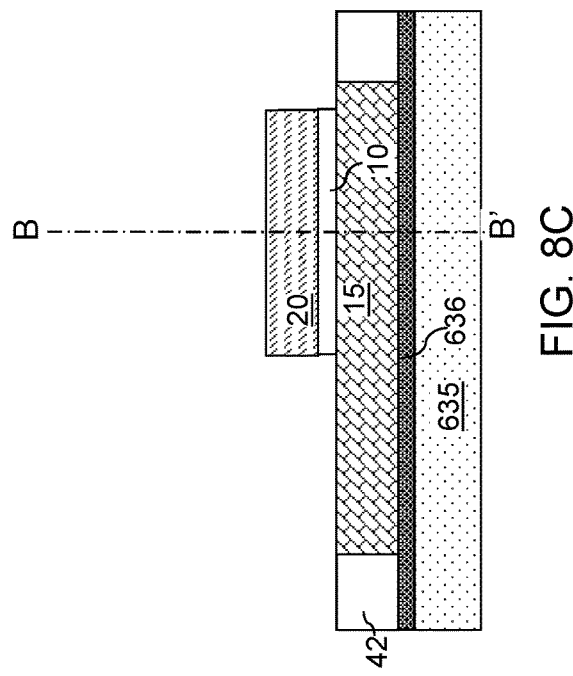
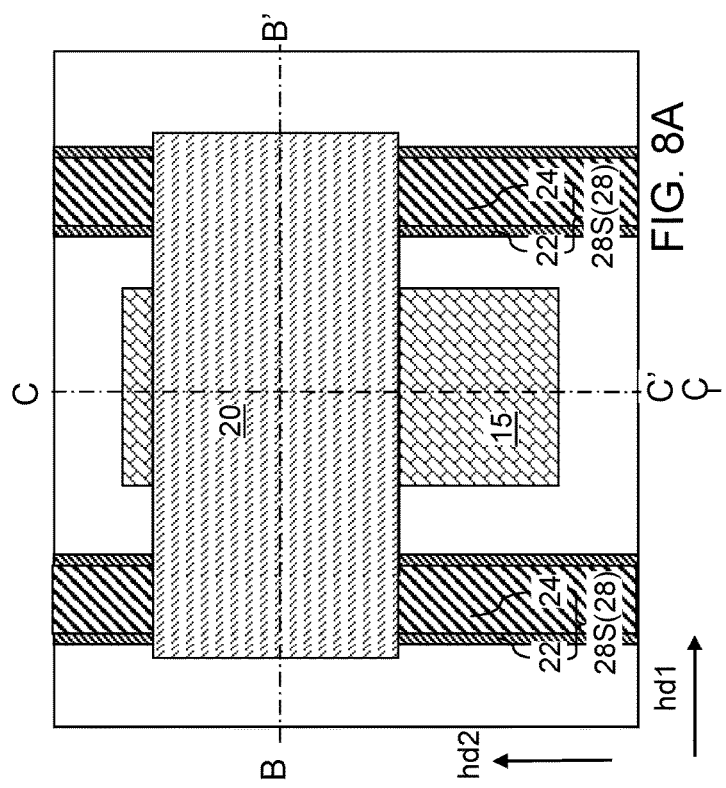
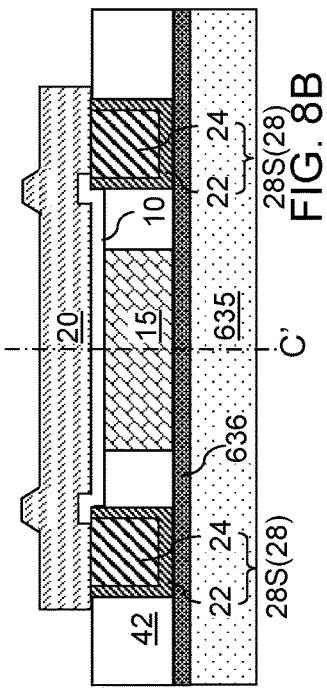

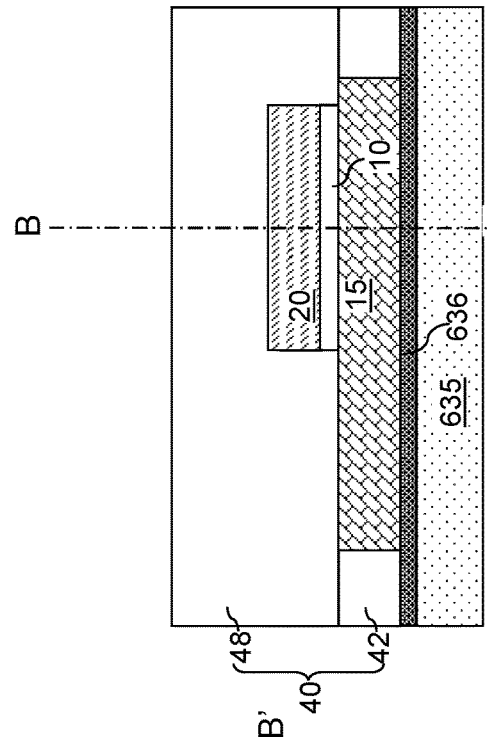
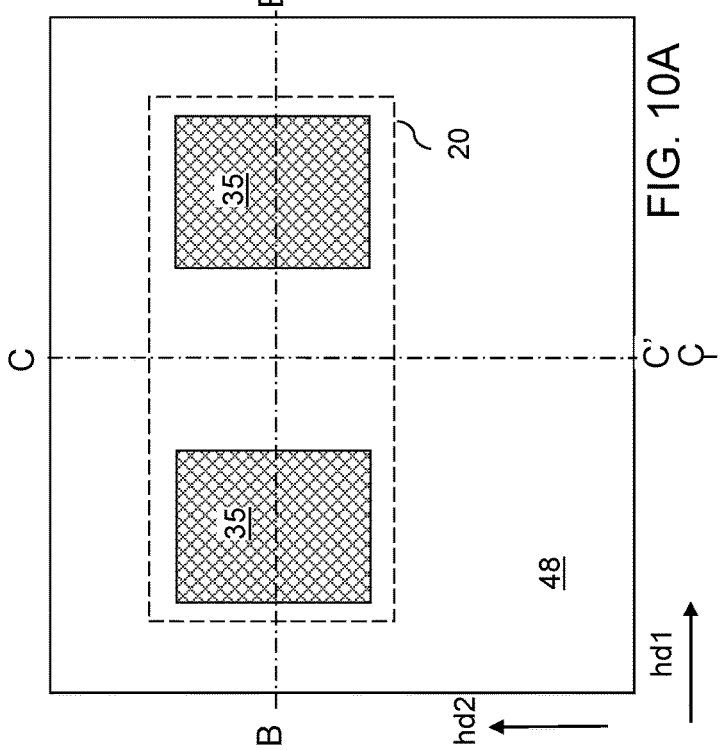
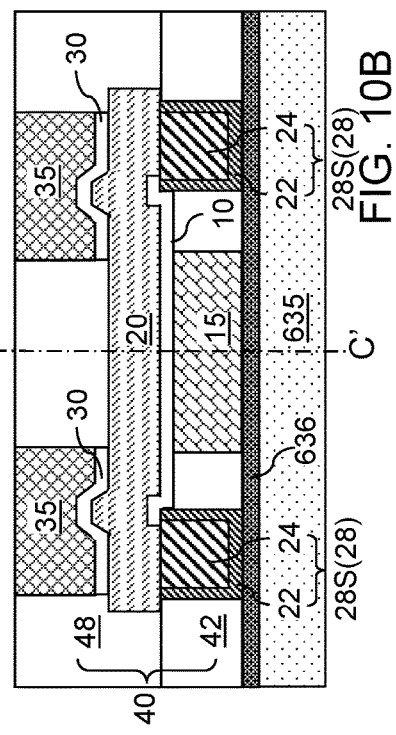
FIG. 10A
FIG. 10B
FIG. 10C

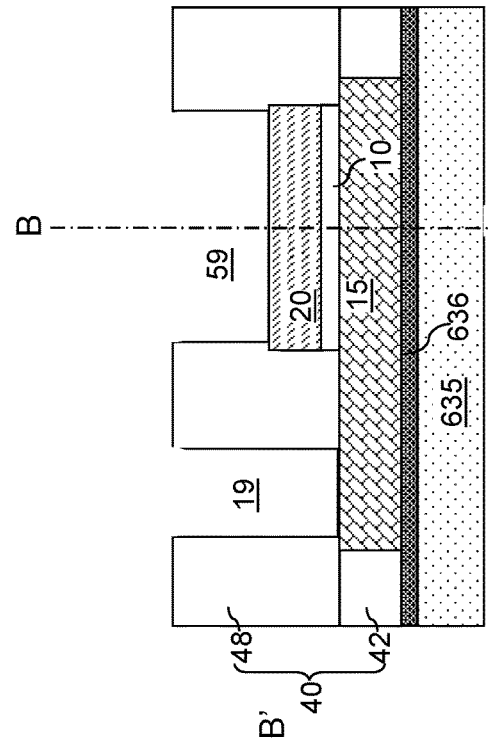
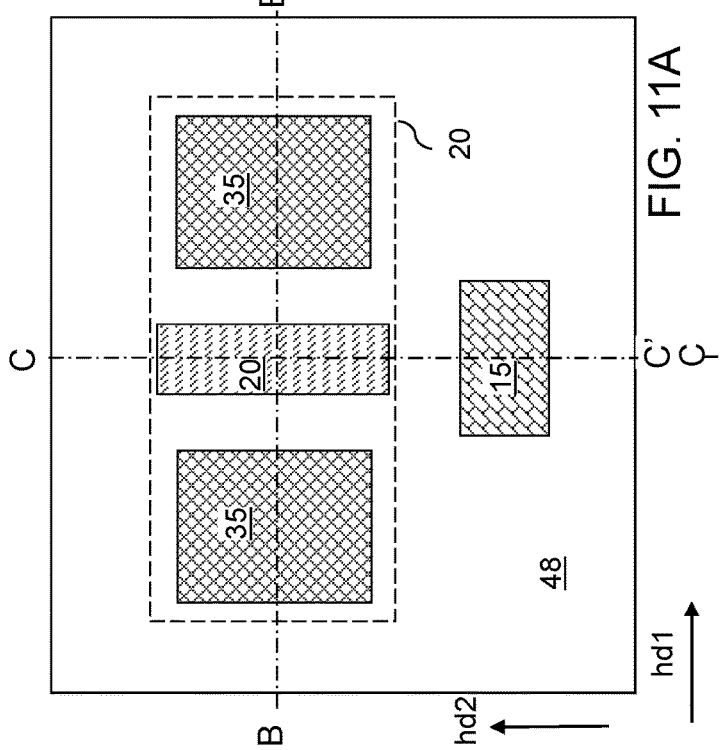
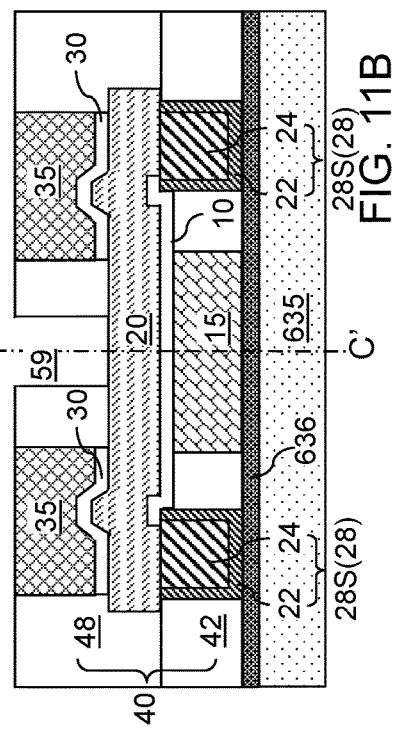
FIG. 11A
FIG. 11B
FIG. 11C

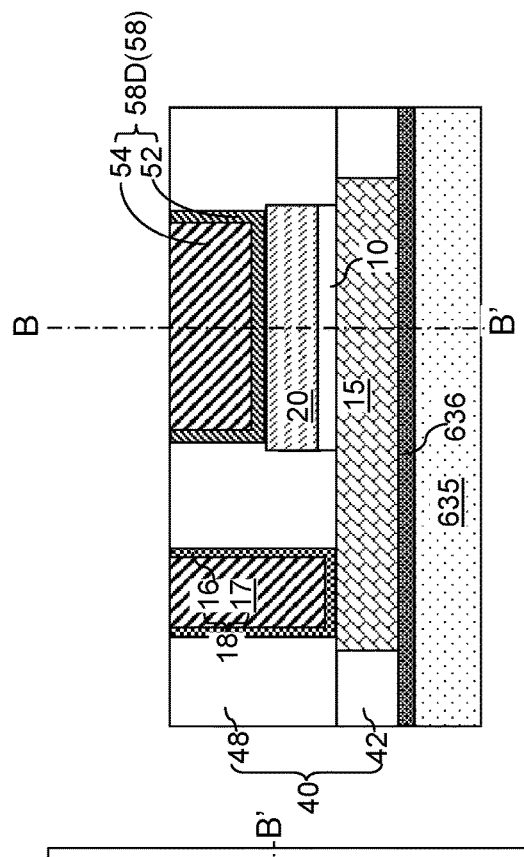
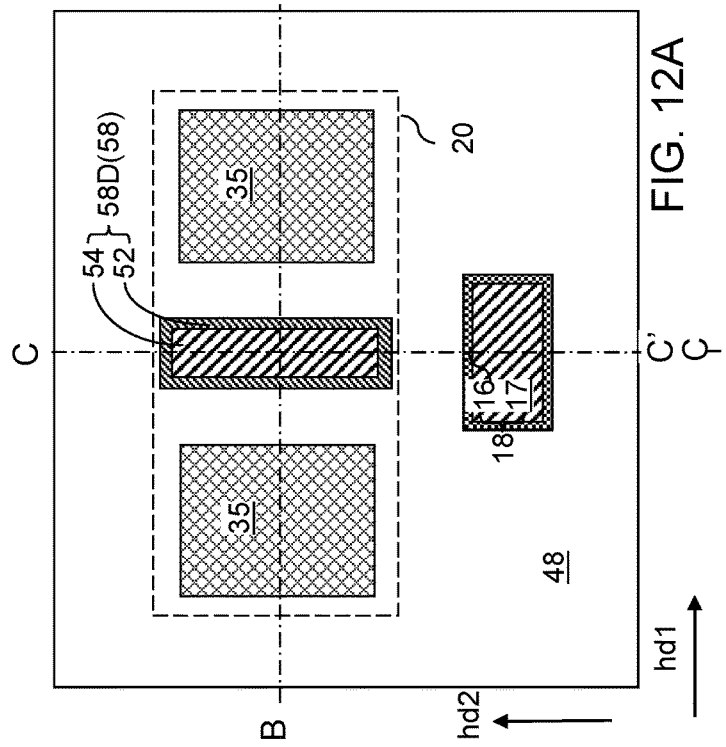
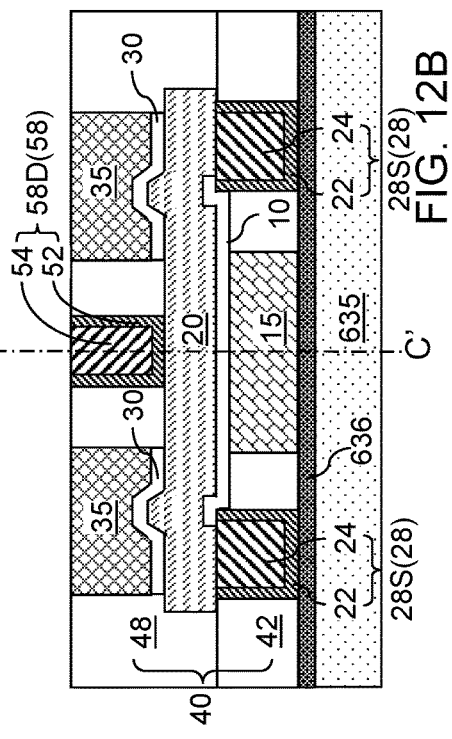
FIG. 12A
FIG. 12B
FIG. 12C

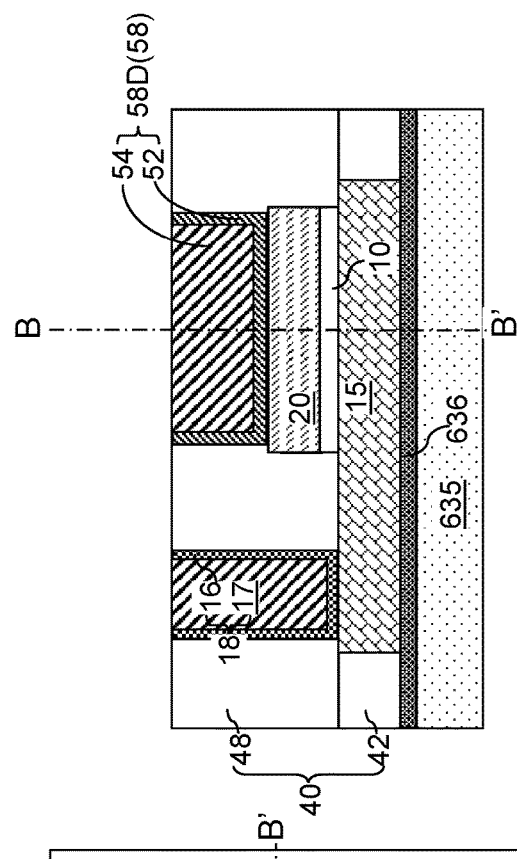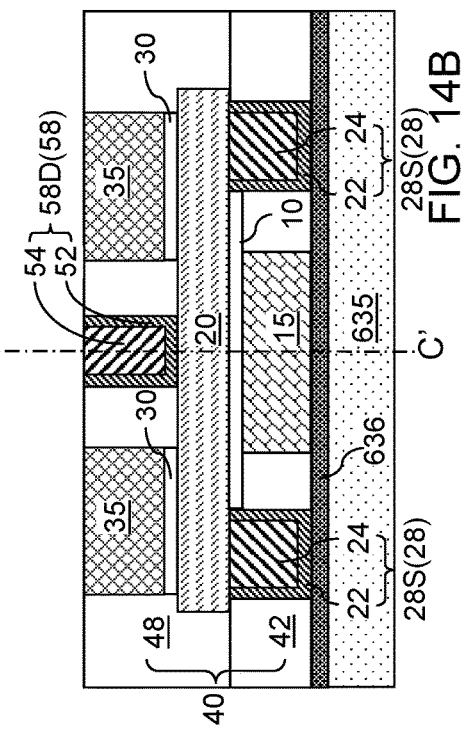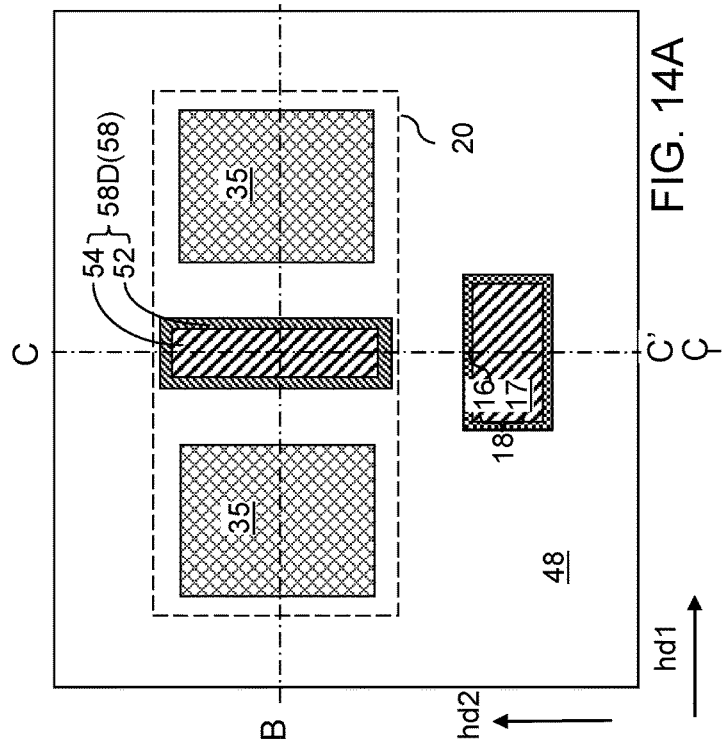
FIG. 14A
FIG. 14B
FIG. 14C

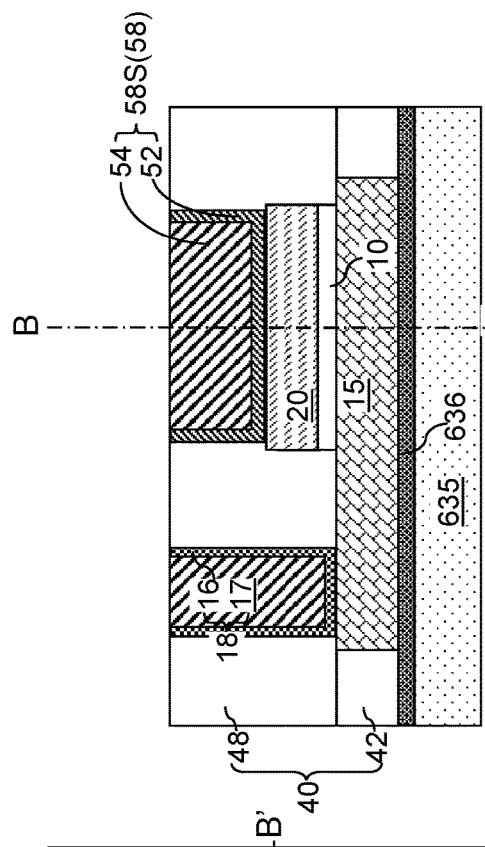
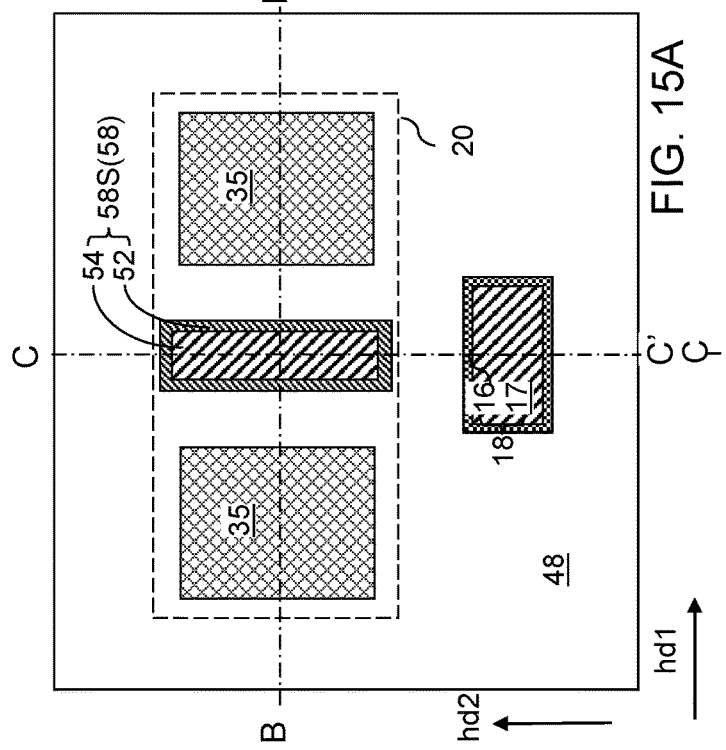
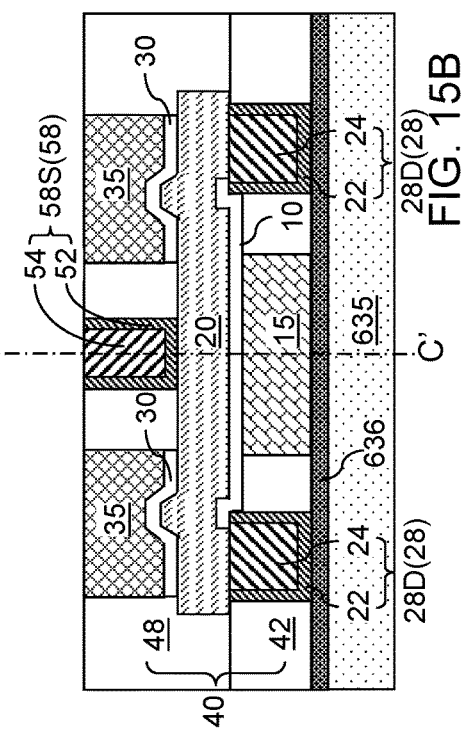
FIG. 15A
FIG. 15B
FIG. 15C

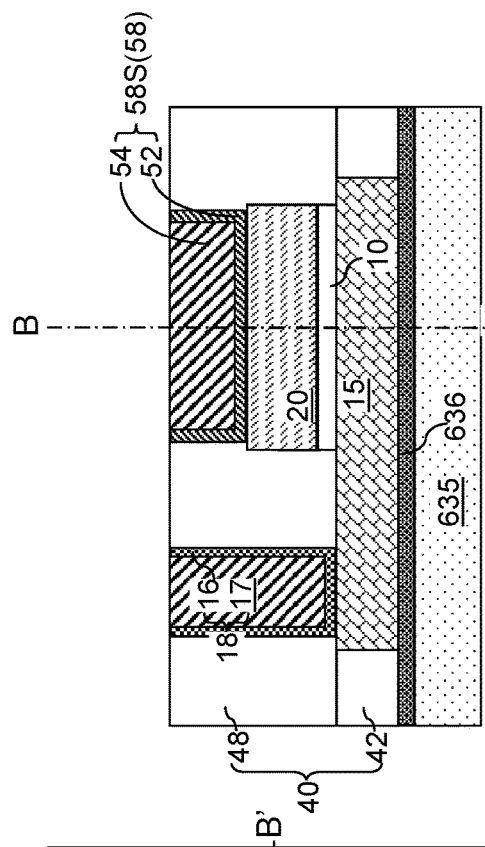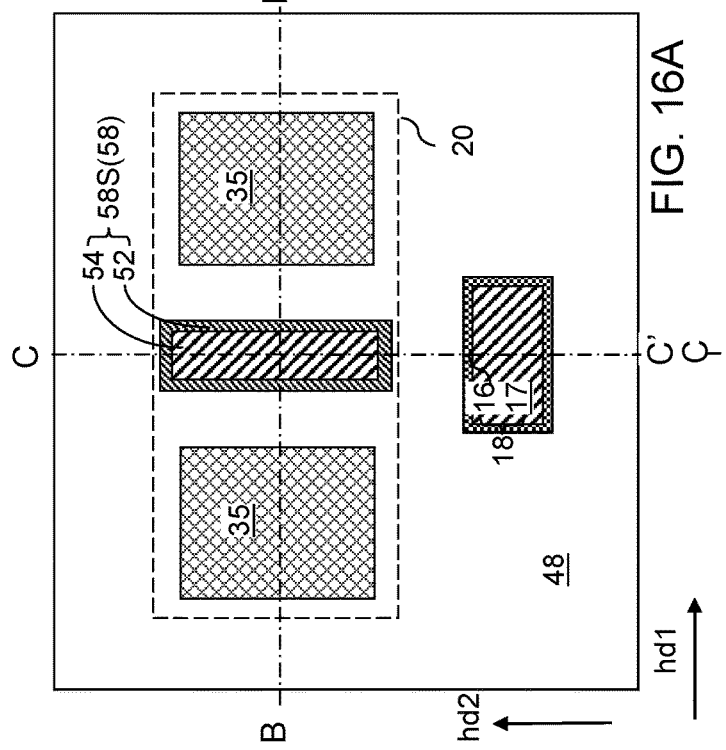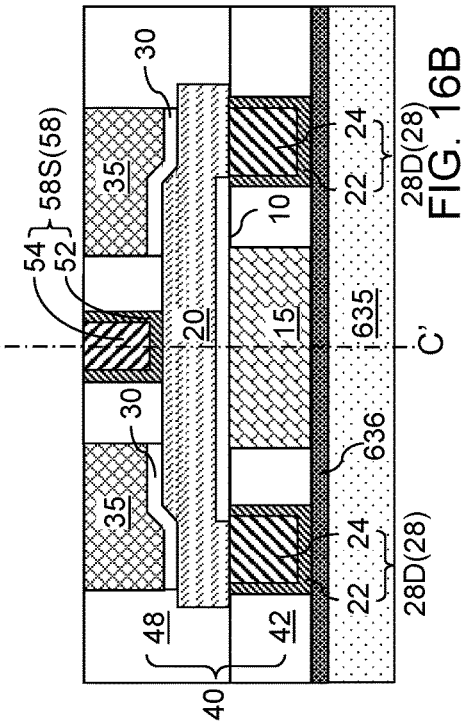

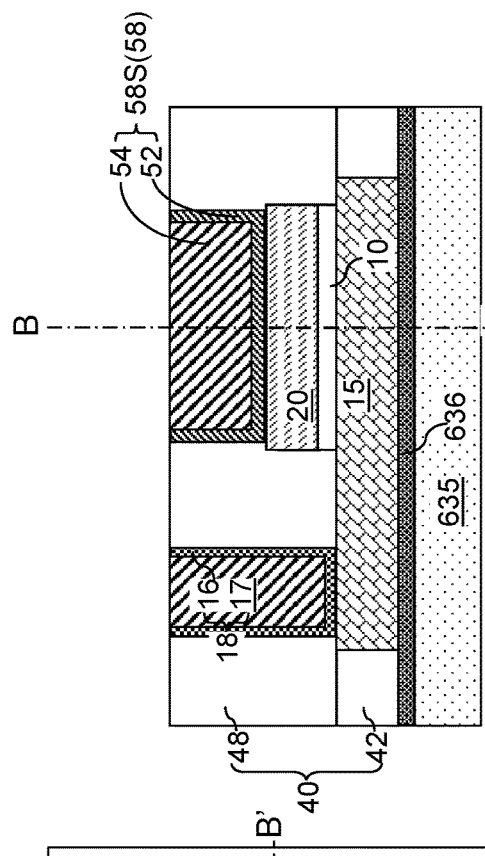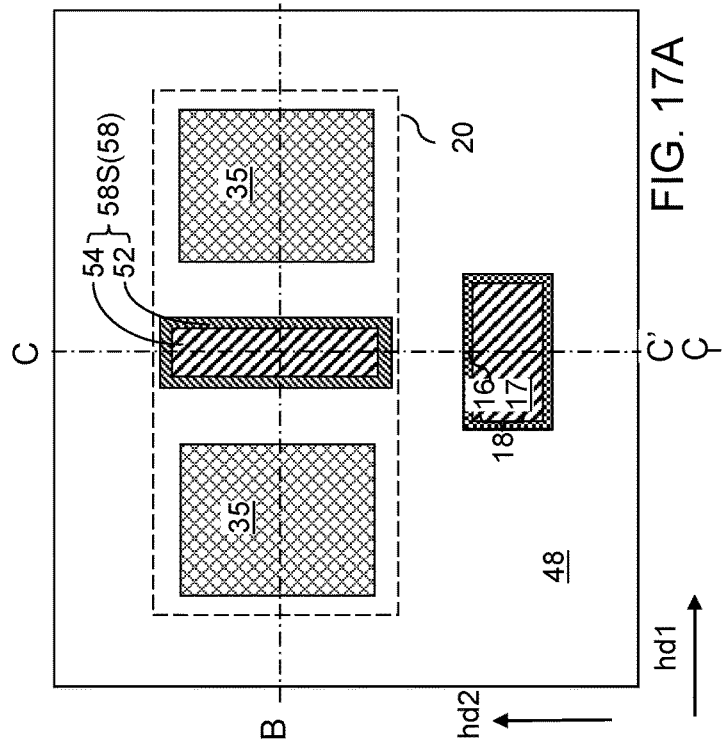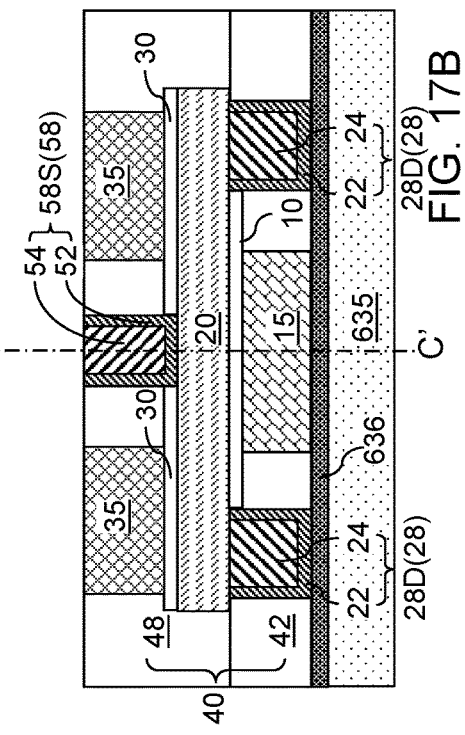

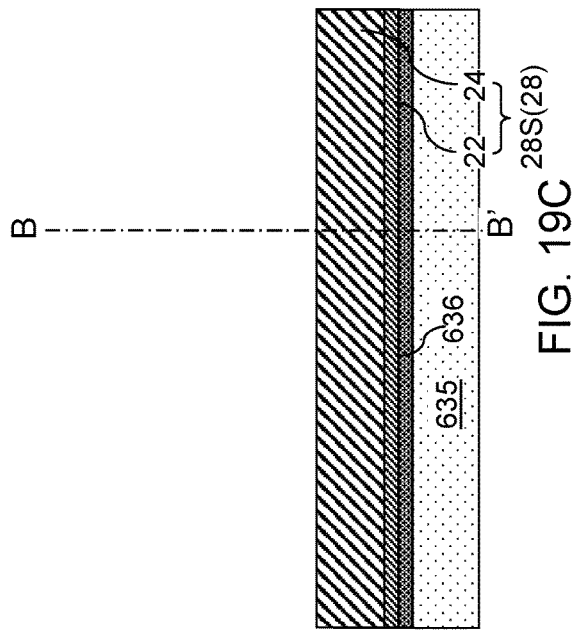
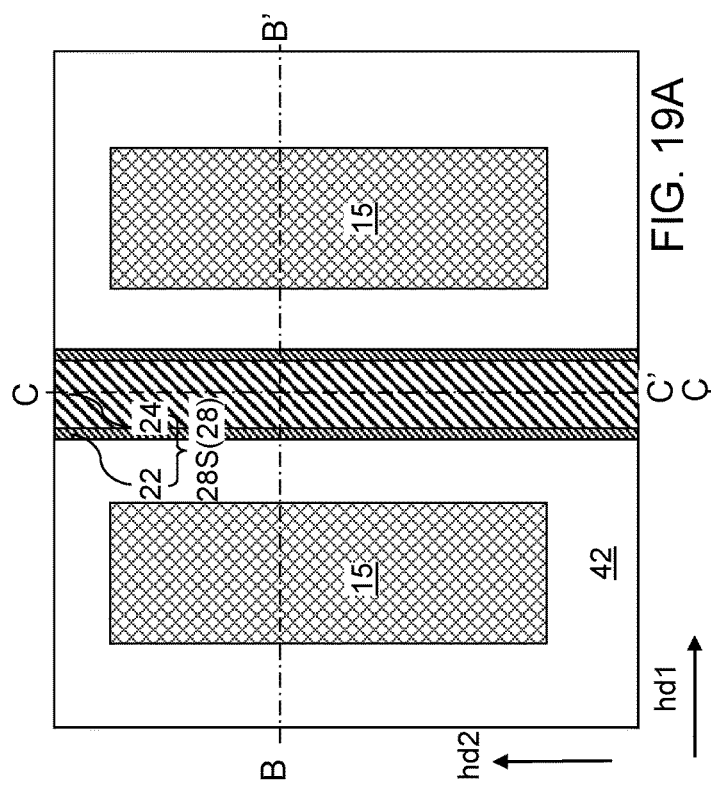
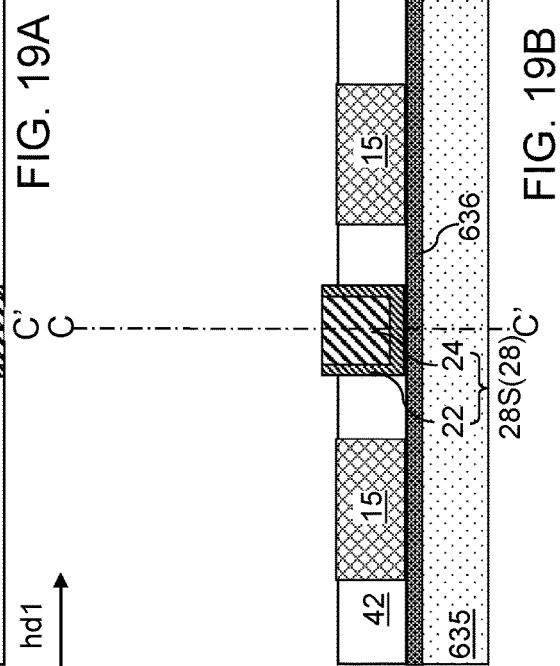
FIG. 19C
FIG. 19A
FIG. 19B

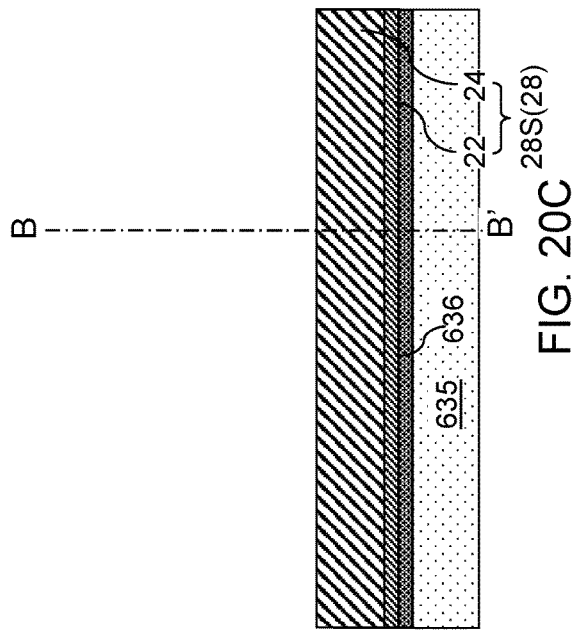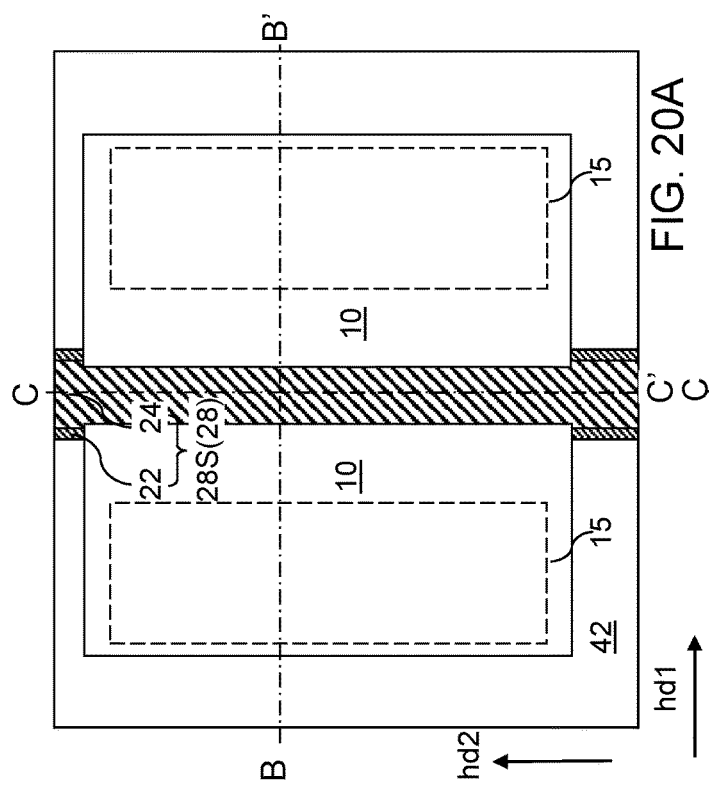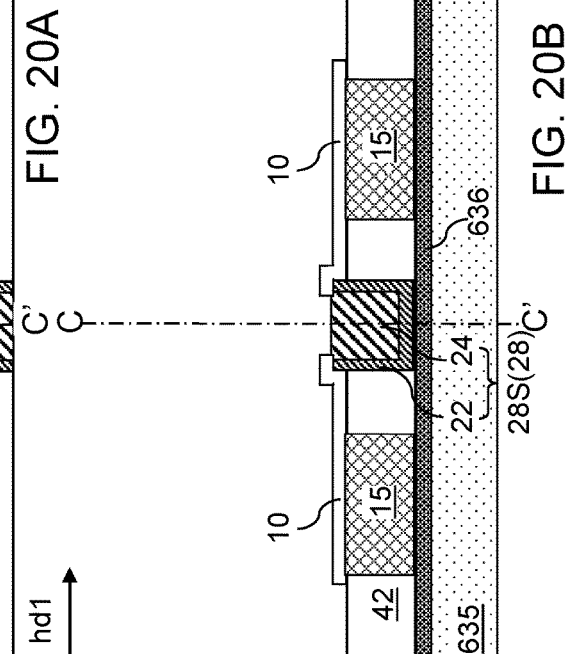

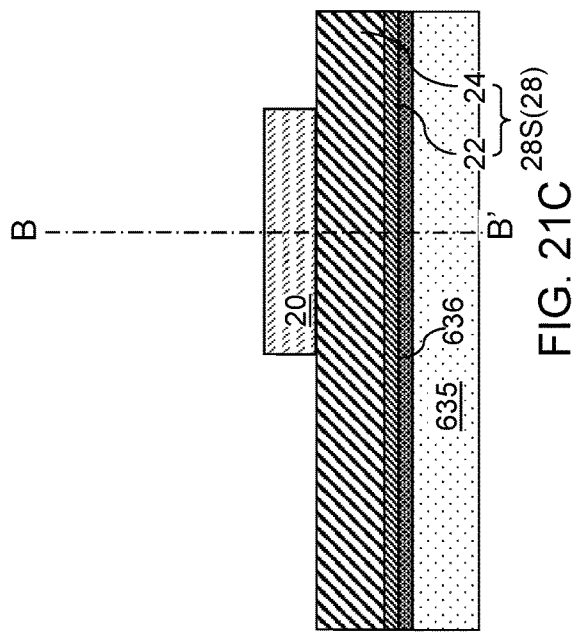
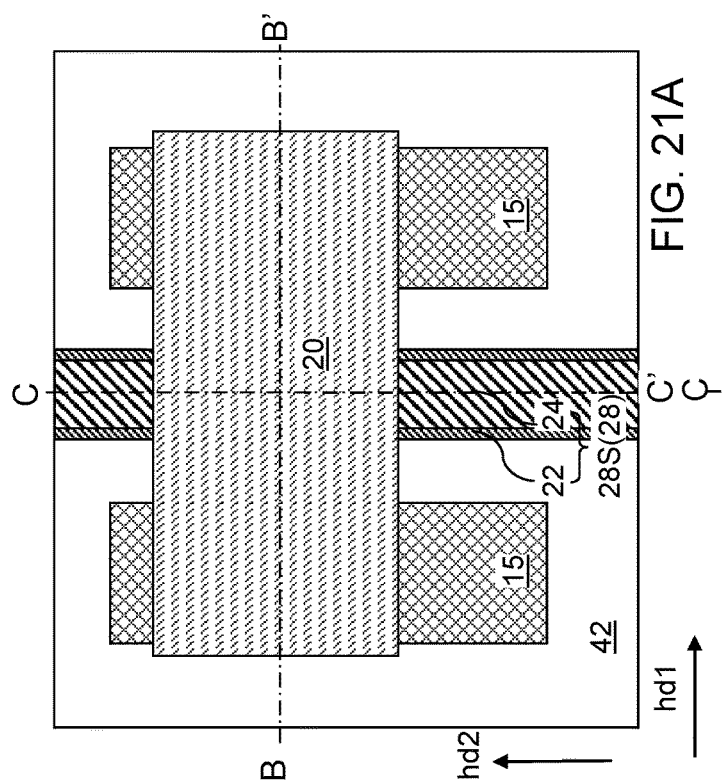
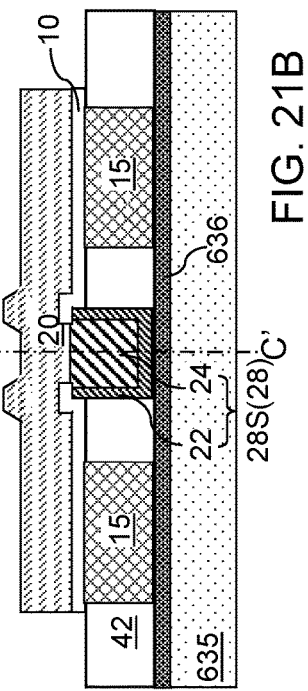
FIG. 21C
FIG. 21A
FIG. 21B

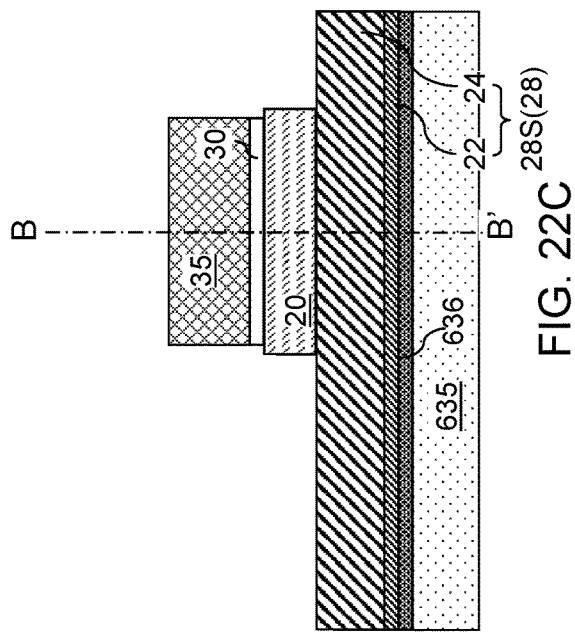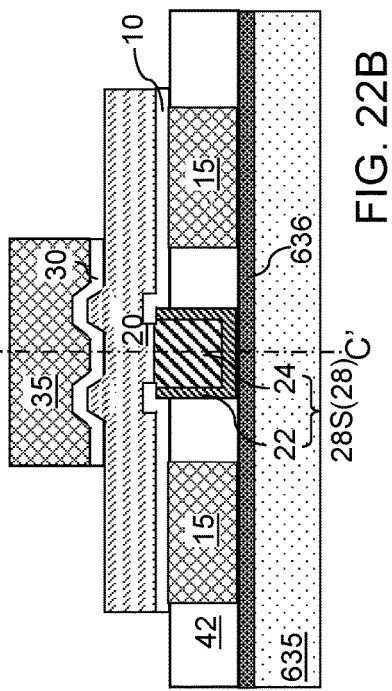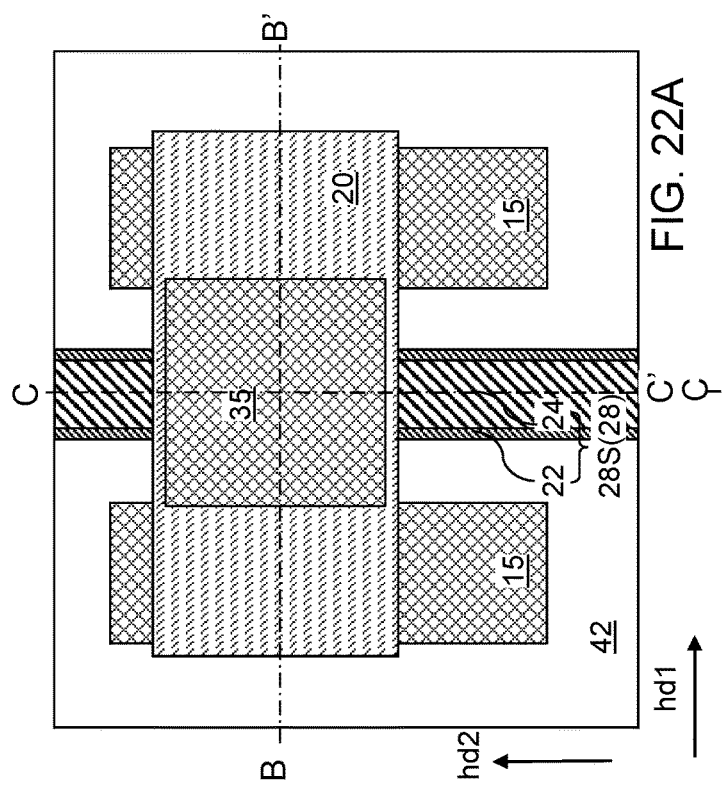

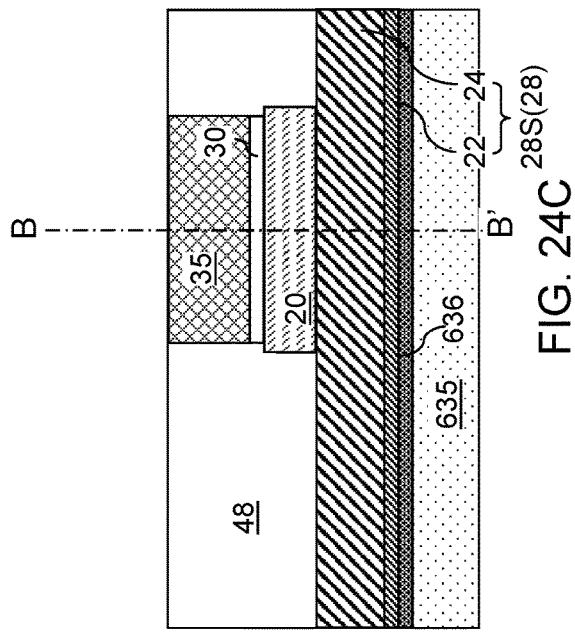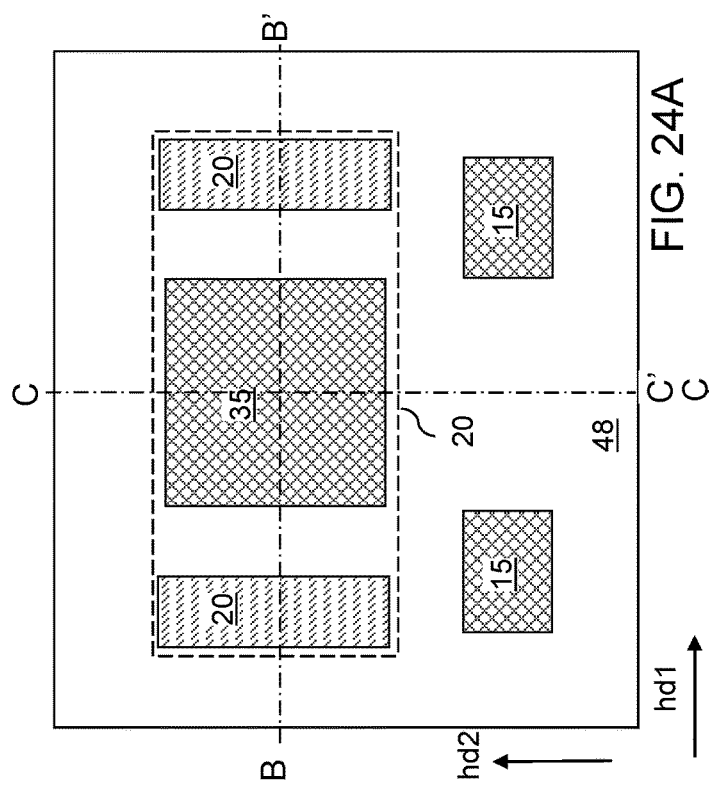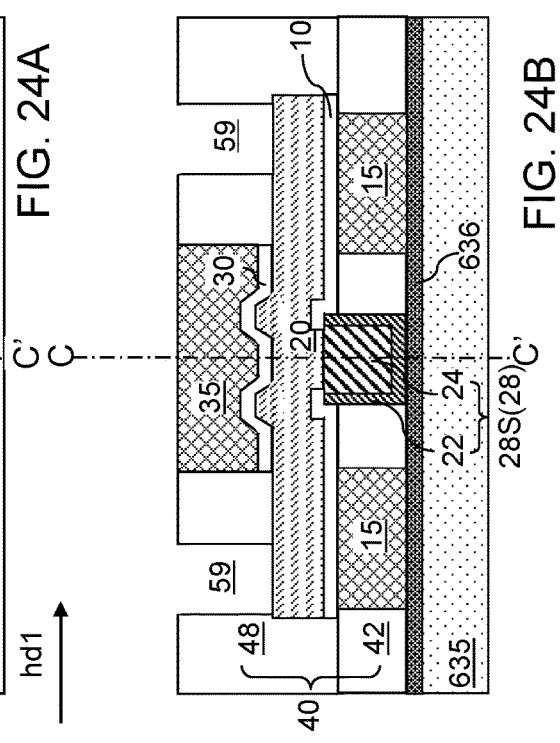
FIG. 24A
FIG. 24B
FIG. 24C

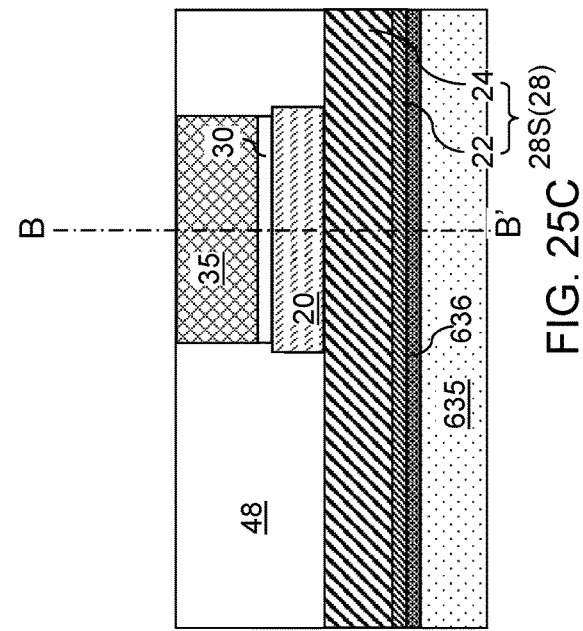
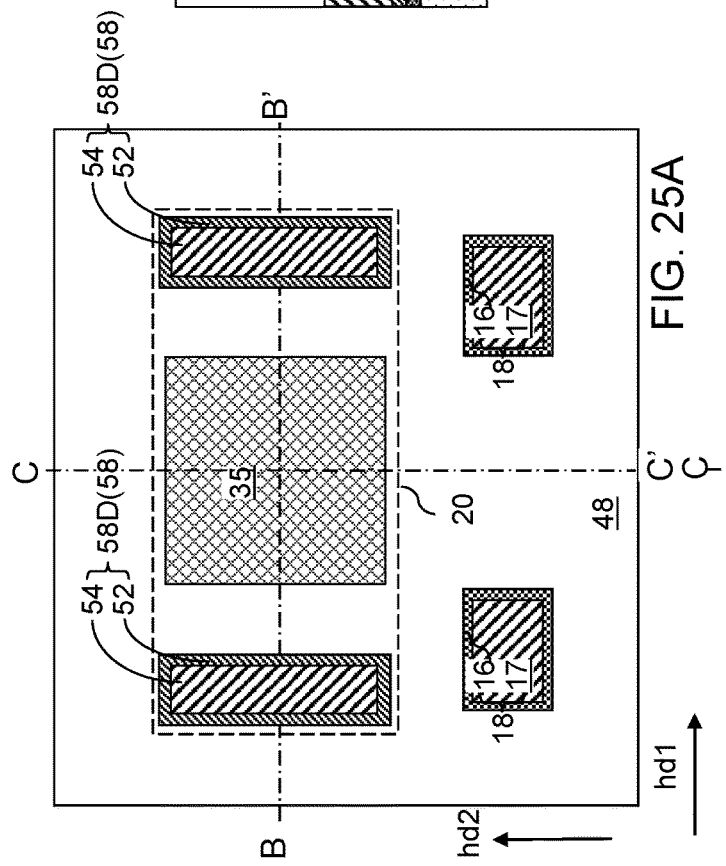
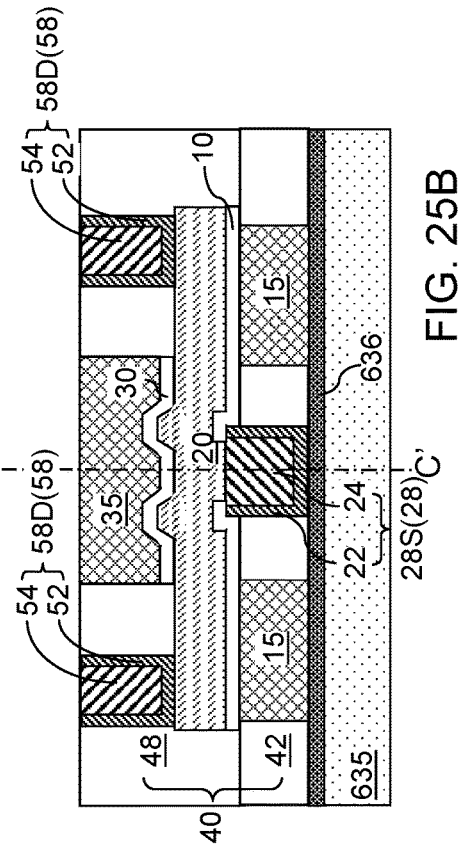
FIG. 25A
FIG. 25B
FIG. 25C

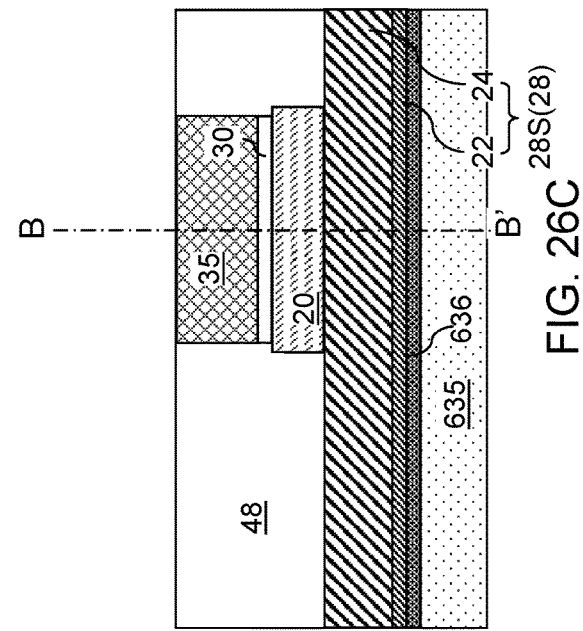
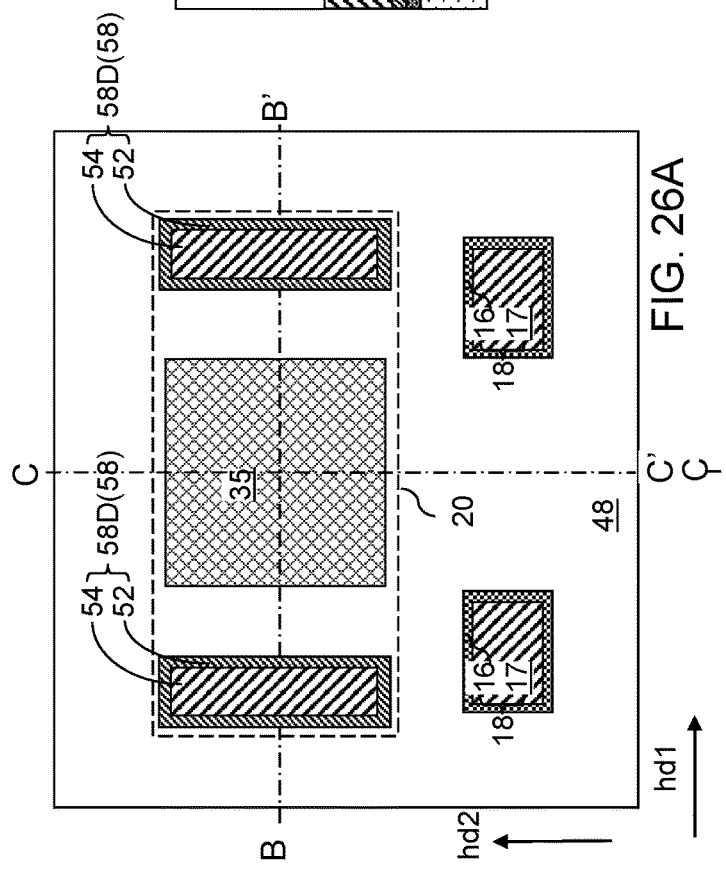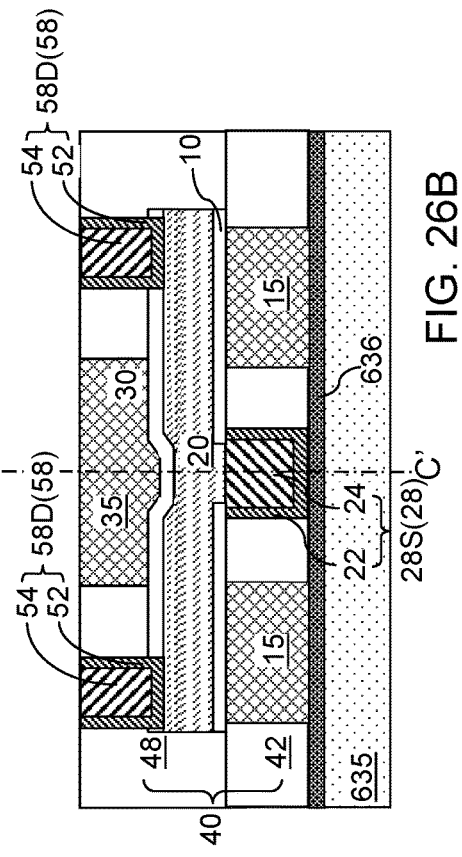
FIG. 26A
FIG. 26B
FIG. 26C

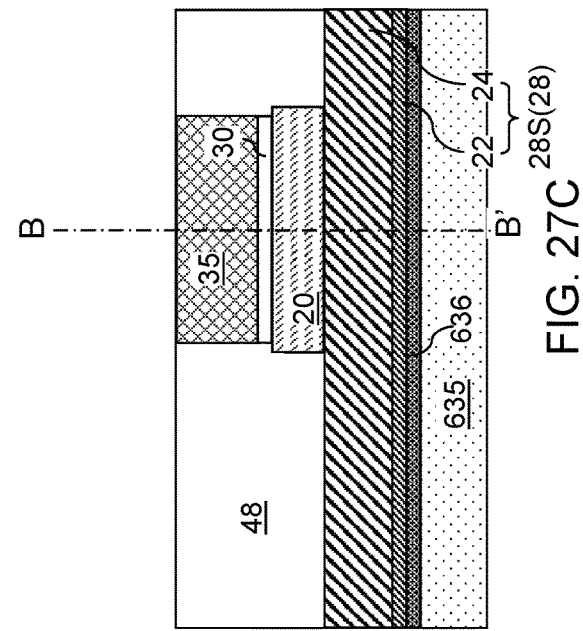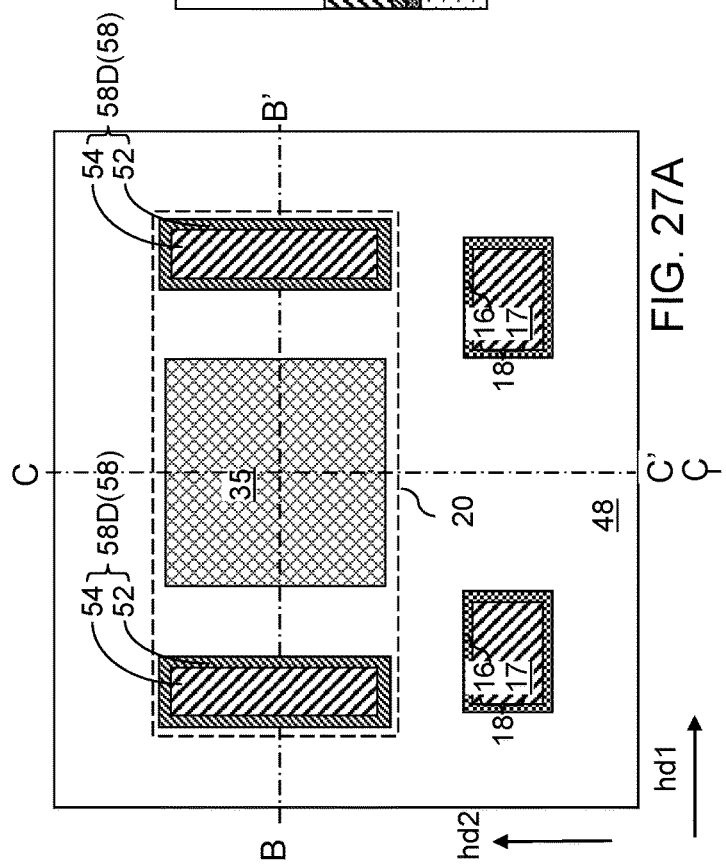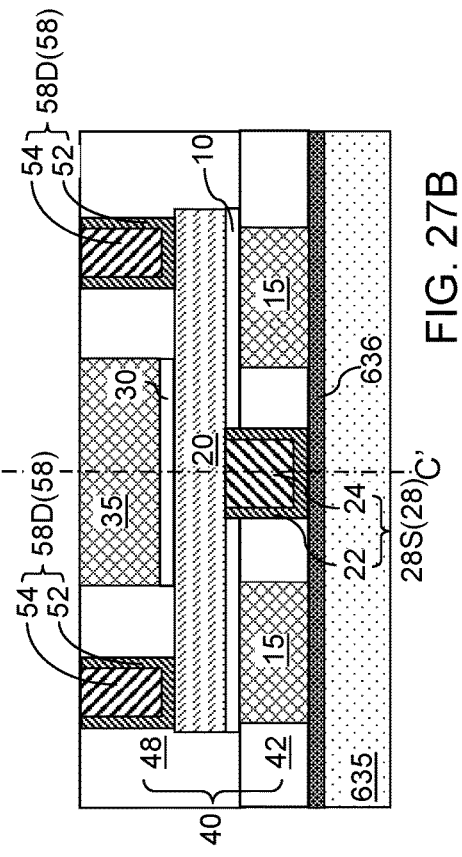

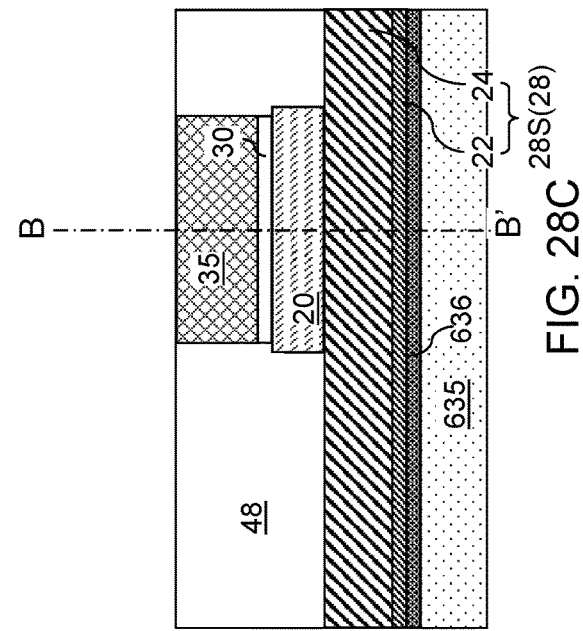
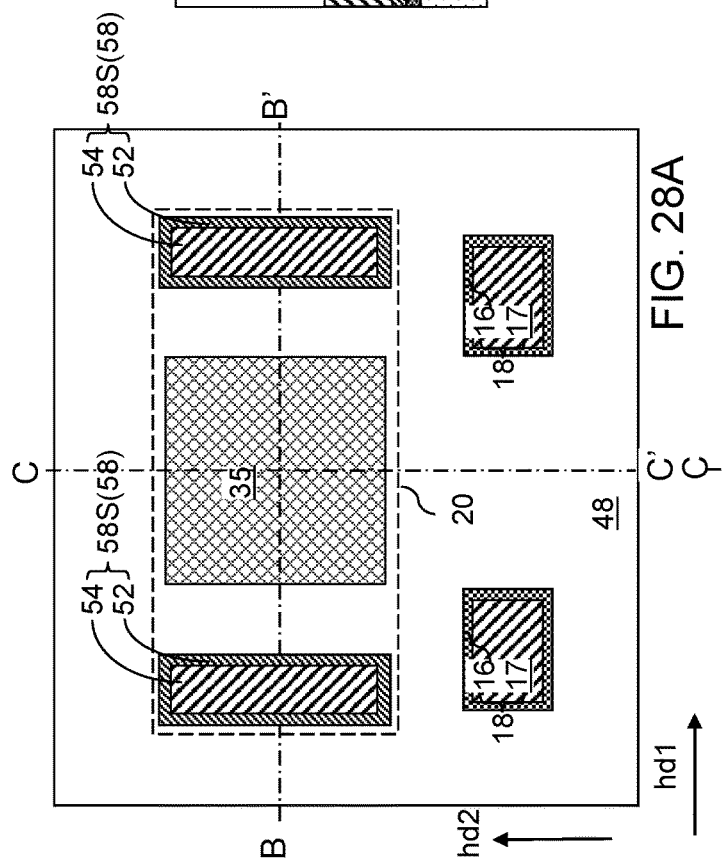
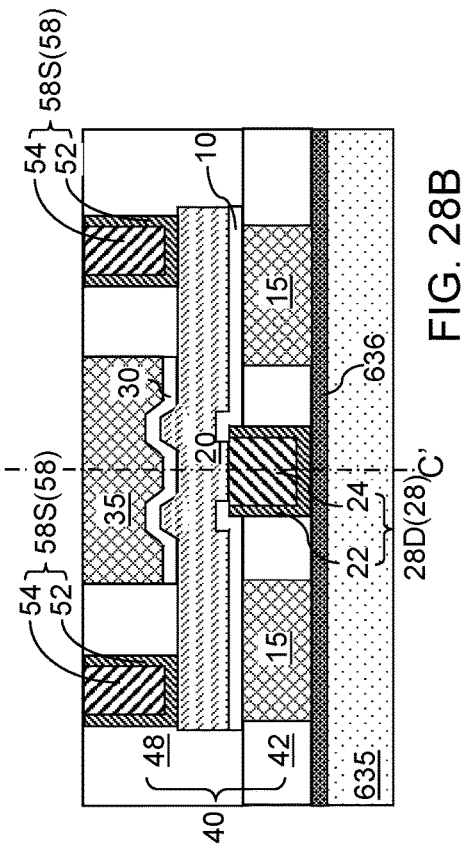
FIG. 28A
FIG. 28B
FIG. 28C

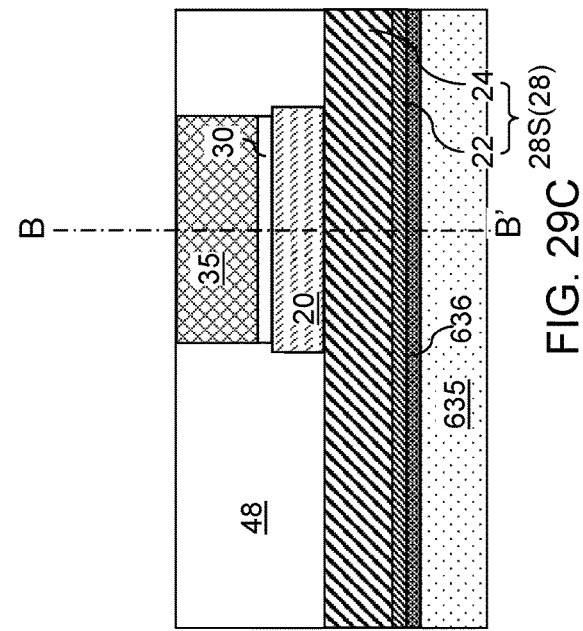
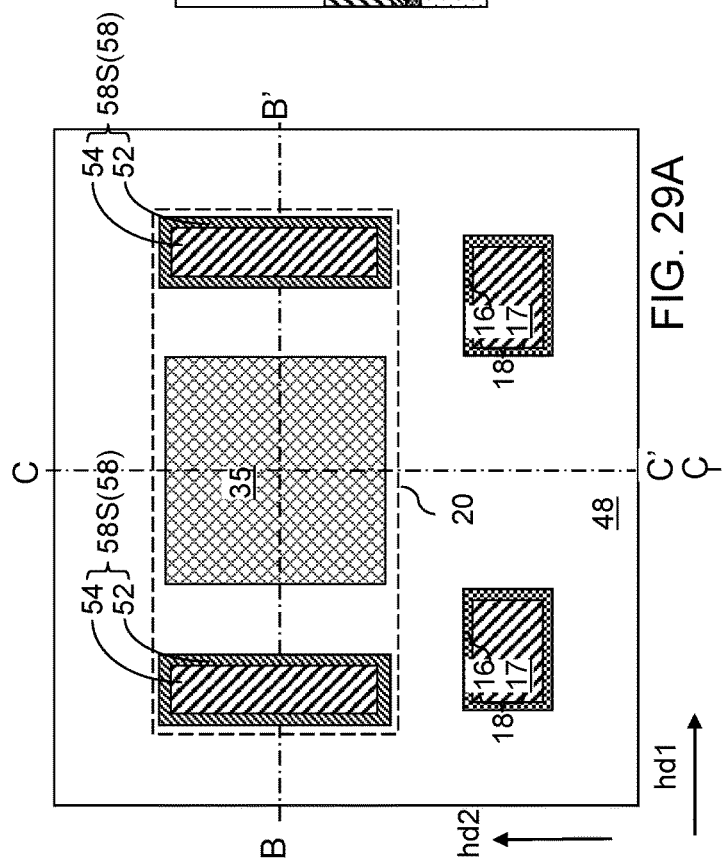
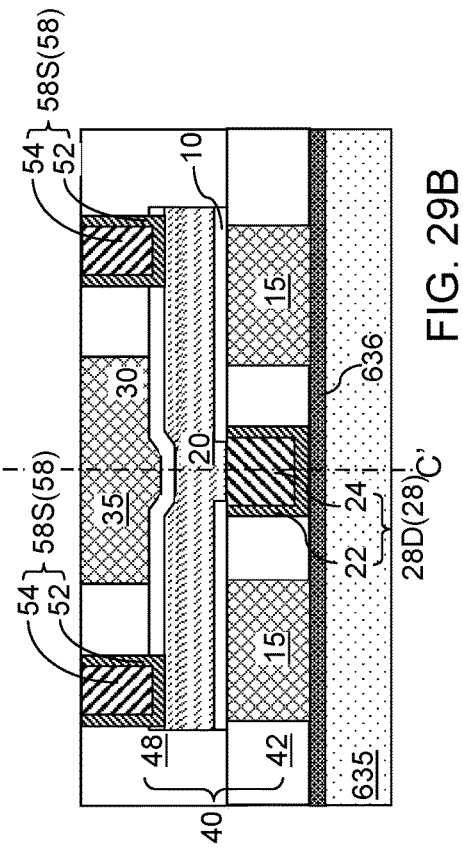
FIG. 29A
FIG. 29B
FIG. 29C

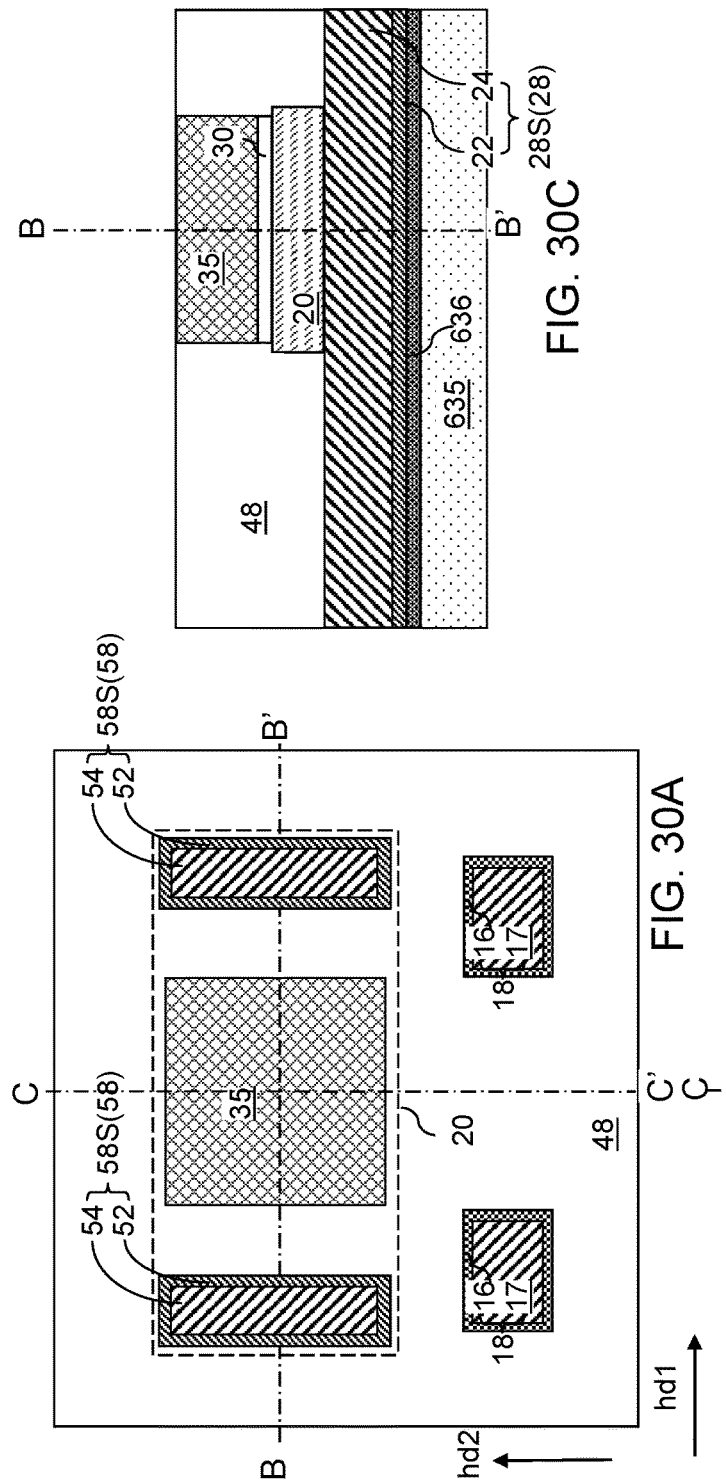

TRI-GATE TRANSISTOR AND METHODS FOR FORMING THE SAME

RELATED APPLICATIONS

This application claims the benefit of priority from a U.S. provisional application Ser. No. 63/173,119, titled "Tri-gate TFT as Selector Use," filed on Apr. 9, 2021, the entire contents of which are incorporated herein by reference.

BACKGROUND

Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques may not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a top-down view of a portion of the first exemplary structure after formation of an insulating layer according to a first embodiment of the present disclosure.

FIG. 2B is a vertical cross-sectional view of the first exemplary structure along the vertical plane B-B' of FIG. 2A.

FIG. 2C is a vertical cross-sectional view of the first exemplary structure along the vertical plane C-C' of FIG. 2A.

FIG. 3A is a top-down view of a region of the first exemplary structure after formation of a recess region in the insulating layer according to the first embodiment of the present disclosure.

FIG. 3B is a vertical cross-sectional view of the first exemplary structure along the vertical plane B-B' of FIG. 3A.

FIG. 3C is a vertical cross-sectional view of the first exemplary structure along the vertical plane C-C' of FIG. 3A.

FIG. 4A is a top-down view of a region of the first exemplary structure after formation of a bottom gate electrode according to the first embodiment of the present disclosure.

FIG. 4B is a vertical cross-sectional view of the first exemplary structure along the vertical plane B-B' of FIG. 4A.

FIG. 4C is a vertical cross-sectional view of the first exemplary structure along the vertical plane C-C' of FIG. 4A.

FIG. 6A is a top-down view of a region of the first exemplary structure after vertically recessing a region between the pair of bottom contact electrodes according to the first embodiment of the present disclosure.

FIG. 6B is a vertical cross-sectional view of the first exemplary structure along the vertical plane B-B' of FIG. 6A.

FIG. 6C is a vertical cross-sectional view of the first exemplary structure along the vertical plane C-C' of FIG. 6A.

FIG. 7A is a top-down view of a region of the first exemplary structure after formation of a bottom gate dielectric according to the first embodiment of the present disclosure.

FIG. 7B is a vertical cross-sectional view of the first exemplary structure along the vertical plane B-B' of FIG. 7A.

FIG. 7C is a vertical cross-sectional view of the first exemplary structure along the vertical plane C-C' of FIG. 7A.

FIG. 8A is a top-down view of a region of the first exemplary structure after formation of an active layer according to the first embodiment of the present disclosure.

FIG. 8B is a vertical cross-sectional view of the first exemplary structure along the vertical plane B-B' of FIG. 8A.

FIG. 8C is a vertical cross-sectional view of the first exemplary structure along the vertical plane C-C' of FIG. 8A.

FIG. 10A is a top-down view of a region of the first exemplary structure after formation of a dielectric layer according to the first embodiment of the present disclosure.

FIG. 10B is a vertical cross-sectional view of the first exemplary structure along the vertical plane B-B' of FIG. 10A.

FIG. 10C is a vertical cross-sectional view of the first exemplary structure along the vertical plane C-C' of FIG. 10A.

FIG. 11A is a top-down view of a region of the first exemplary structure after formation of a contact via cavity and a bottom gate contact via cavity according to the first embodiment of the present disclosure.

FIG. 11B is a vertical cross-sectional view of the first exemplary structure along the vertical plane B-B' of FIG. 11A.

FIG. 11C is a vertical cross-sectional view of the first exemplary structure along the vertical plane C-C' of FIG. 11A.

FIG. 12A is a top-down view of a region of the first exemplary structure after formation of a top contact electrode and a backside electrode contact via structure according to the first embodiment of the present disclosure.

FIG. 12B is a vertical cross-sectional view of the first exemplary structure along the vertical plane B-B' of FIG. 12A.

FIG. 12C is a vertical cross-sectional view of the first exemplary structure along the vertical plane C-C' of FIG. 12A.

FIG. 14A is a top-down view of a region of a second alternative configuration of the first exemplary structure according to the first embodiment of the present disclosure.

FIG. 14B is a vertical cross-sectional view of the first exemplary structure along the vertical plane B-B' of FIG. 14A.

FIG. 14C is a vertical cross-sectional view of the first exemplary structure along the vertical plane C-C' of FIG. 14A.

FIG. 15A is a top-down view of a region of a second exemplary structure according to a second embodiment of the present disclosure.

FIG. 15B is a vertical cross-sectional view of the second exemplary structure along the vertical plane B-B' of FIG. 15A.

FIG. 15C is a vertical cross-sectional view of the second exemplary structure along the vertical plane C-C' of FIG. 15A.

FIG. 16A is a top-down view of a region of a first alternative configuration of the second exemplary structure according to the second embodiment of the present disclosure.

FIG. 16B is a vertical cross-sectional view of the second exemplary structure along the vertical plane B-B' of FIG. 16A.

FIG. 16C is a vertical cross-sectional view of the second exemplary structure along the vertical plane C-C' of FIG. 16A.

FIG. 17A is a top-down view of a region of a second alternative configuration of the second exemplary structure according to the second embodiment of the present disclosure.

FIG. 17B is a vertical cross-sectional view of the second exemplary structure along the vertical plane B-B' of FIG. 17A.

FIG. 17C is a vertical cross-sectional view of the second exemplary structure along the vertical plane C-C' of FIG. 17A.

FIG. 19A is a top-down view of a region of the third exemplary structure after vertically recessing regions around the pair of bottom gate electrodes according to the third embodiment of the present disclosure.

FIG. 19B is a vertical cross-sectional view of the third exemplary structure along the vertical plane B-B' of FIG. 19A.

FIG. 19C is a vertical cross-sectional view of the third exemplary structure along the vertical plane C-C' of FIG. 19A.

FIG. 20A is a top-down view of a region of the third exemplary structure after formation of a pair of bottom gate dielectrics according to the third embodiment of the present disclosure.

FIG. 20B is a vertical cross-sectional view of the third exemplary structure along the vertical plane B-B' of FIG. 20A.

FIG. 20C is a vertical cross-sectional view of the third exemplary structure along the vertical plane C-C' of FIG. 20A.

FIG. 21A is a top-down view of a region of the third exemplary structure after formation of an active layer according to the third embodiment of the present disclosure.

FIG. 21B is a vertical cross-sectional view of the third exemplary structure along the vertical plane B-B' of FIG. 21A.

FIG. 21C is a vertical cross-sectional view of the third exemplary structure along the vertical plane C-C' of FIG. 21A.

FIG. 22A is a top-down view of a region of the third exemplary structure after formation of a top gate stack according to the third embodiment of the present disclosure.

FIG. 22B is a vertical cross-sectional view of the third exemplary structure along the vertical plane B-B' of FIG. 22A.

FIG. 22C is a vertical cross-sectional view of the third exemplary structure along the vertical plane C-C' of FIG. 22A.

FIG. 24A is a top-down view of a region of the third exemplary structure after formation of a pair of top contact cavities and a pair of bottom gate contact via cavities according to the third embodiment of the present disclosure.

FIG. 24B is a vertical cross-sectional view of the third exemplary structure along the vertical plane B-B' of FIG. 24A.

FIG. 24C is a vertical cross-sectional view of the third exemplary structure along the vertical plane C-C' of FIG. 24A.

FIG. 25A is a top-down view of a region of the third exemplary structure after formation of a pair of top contact electrodes and a pair of backside electrode contact via structures according to the third embodiment of the present disclosure.

FIG. 25B is a vertical cross-sectional view of the third exemplary structure along the vertical plane B-B' of FIG. 25A.

FIG. 25C is a vertical cross-sectional view of the third exemplary structure along the vertical plane C-C' of FIG. 25A.

FIG. 26A is a top-down view of a region of a first alternative configuration of the third exemplary structure according to the third embodiment of the present disclosure.

FIG. 26B is a vertical cross-sectional view of the third exemplary structure along the vertical plane B-B' of FIG. 26A.

FIG. 26C is a vertical cross-sectional view of the third exemplary structure along the vertical plane C-C' of FIG. 26A.

FIG. 27A is a top-down view of a region of a second alternative configuration of the third exemplary structure according to the third embodiment of the present disclosure.

FIG. 27B is a vertical cross-sectional view of the third exemplary structure along the vertical plane B-B' of FIG. 27A.

FIG. 27C is a vertical cross-sectional view of the third exemplary structure along the vertical plane C-C' of FIG. 27A.

FIG. 28A is a top-down view of a region of a fourth exemplary structure according to a fourth embodiment of the present disclosure.

FIG. 28B is a vertical cross-sectional view of the fourth exemplary structure along the vertical plane B-B' of FIG. 28A.

FIG. 28C is a vertical cross-sectional view of the fourth exemplary structure along the vertical plane C-C' of FIG. 28A.

FIG. 29A is a top-down view of a region of a first alternative configuration of the fourth exemplary structure according to the fourth embodiment of the present disclosure.

FIG. 29B is a vertical cross-sectional view of the fourth exemplary structure along the vertical plane B-B' of FIG. 29A.

FIG. 29C is a vertical cross-sectional view of the fourth exemplary structure along the vertical plane C-C' of FIG. 29A.

FIG. 30A is a top-down view of a region of a second alternative configuration of the fourth exemplary structure according to the fourth embodiment of the present disclosure.

FIG. 30B is a vertical cross-sectional view of the fourth exemplary structure along the vertical plane B-B' of FIG. 30A.

FIG. 30C is a vertical cross-sectional view of the fourth exemplary structure along the vertical plane C-C' of FIG. 30A.

DETAILED DESCRIPTION

Figure 1:
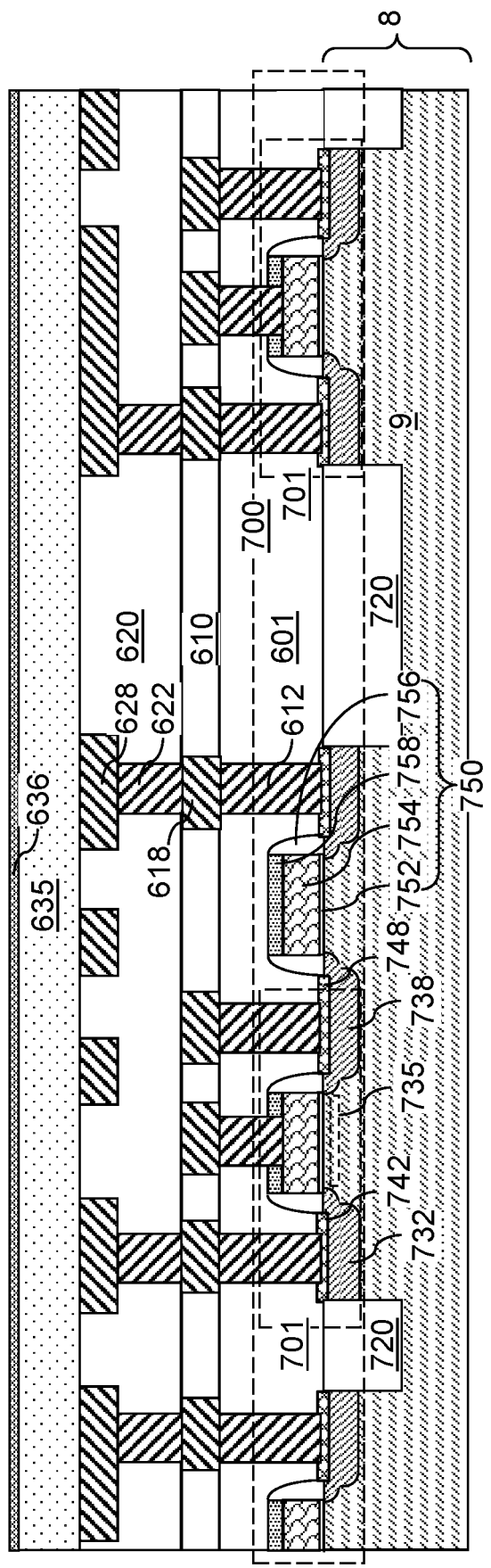
FIG. 1 is a vertical cross-sectional view of a first exemplary structure after formation of complementary metal-oxide-semiconductor (CMOS) transistors, first metal interconnect structures formed in lower-level dielectric layers, an insulating material layer, and an optional etch stop dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor structure including at least one transistor, which may be a plurality of transistors. In one embodiment, the transistor can be a thin film transistor. Embodiments of the present disclosure provide a transistor including three gate electrodes, which control current flow through two top channels and two bottom channels between a source electrode and a pair of drain electrodes, or between a drain electrode and a pair of source electrodes. The tri-gate configuration of the present disclosure provides a high on/off current ratio by controlling the four channels. High resistance regions within channels may be eliminated or minimized by providing an areal overlap between a center gate electrode and a pair of off-center gate electrodes. The center gate electrode and the pair of off-center gate electrodes may be formed on opposite sides of an active region. The high on-current provided by the thin film transistor may be advantageously used for a random access memory switch application.

The four channels include a pair of top channels and a pair of bottom channels. The top channels and the bottom channels may have different lateral extents, and the overlap area between a pair of a top channel and a bottom channel may be adjusted to increase or decrease the channel current and/or the threshold voltage for the different channels. The ratio of the lateral dimension of the center gate electrode along the channel direction may be the same as, less than, or greater than, the lateral dimensions of each of the off-center gate electrodes based on device requirements. The various aspects of the present disclosure are described herebelow in detail with reference to accompanying drawings.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate stack 750. The semiconductor channel 735 may include a single crystalline semiconductor material. Each gate stack 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

In embodiments in which an array of memory cells may be subsequently formed at a level of a dielectric layer, the field effect transistors 701 may include a circuit that provides functions that operate the array of memory cells. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. In embodiments in which the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of transistors (e.g., thin film transistors) to be subsequently formed. In this embodiment, the programming control circuit may be configured to provide a first programming pulse that programs a respective ferroelectric dielectric layer in a selected ferroelectric memory cell into a first polarization state in which electrical polarization in the ferroelectric dielectric layer points toward a first electrode of the selected ferroelectric memory cell, and to provide a second programming pulse that programs the ferroelectric dielectric layer in the selected ferroelectric memory cell into a second polarization state in which the electrical polarization in the ferroelectric dielectric layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element can refer to an element having electrical conductivity in the range from $1.0 \times 10^{-6}$ S/cm to $1.0 \times 10^5$ S/cm. As used herein, a "semiconductor material" can refer to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant.

According to an aspect of the present disclosure, the field effect transistors 701 may be subsequently electrically connected to drain electrodes and gate electrodes of access transistors including active layers to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric layers may be subsequently formed over the substrate 8 and the semiconductor devices thereupon (such as field effect transistors 701). In an illustrative example, the dielectric layers may include, for example, a first dielectric layer 601 that may be a layer that surrounds the contact structure connected to the source and drains (sometimes referred to as a contact-level dielectric layer 601), a first interconnect-level dielectric layer 610, and a second interconnect-level dielectric layer 620. The metal interconnect structures may include device contact via structures 612 formed in the first dielectric layer 601 and contact a respective component of the CMOS circuitry 700, first metal line structures 618 formed in the first interconnect-level dielectric layer 610, first metal via structures 622 formed in a lower portion of the second interconnect-level dielectric layer 620, and second metal line structures 628 formed in an upper portion of the second interconnect-level dielectric layer 620.

Each of the dielectric layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material.

Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric layers (601, 610, 620) are herein referred to as lower-lower-level dielectric layers. The metal interconnect structures (612, 618, 622, 628) formed within in the lower-level dielectric layers are herein referred to as lower-level metal interconnect structures.

While the present disclosure is described using an embodiment wherein thin film transistors may be formed over the second interconnect-level dielectric layer 620, other embodiments are expressly contemplated herein in which the array of memory cells may be formed at a different metal interconnect level. Further, while the present disclosure is described using an embodiment in which a semiconductor substrate is used as the substrate 8, embodiments are expressly contemplated herein in which an insulating substrate or a conductive substrate is used as the substrate 8.

The set of all dielectric layer that are formed prior to formation of an array of thin film transistors or an array of ferroelectric memory cells is collectively referred to as lower-level dielectric layers (601, 610, 620). The set of all metal interconnect structures that is formed within the lower-level dielectric layers (601, 610, 620) is herein referred to as first metal interconnect structures (612, 618, 622, 628). Generally, first metal interconnect structures (612, 618, 622, 628) formed within at least one lower-level dielectric layer (601, 610, 620) may be formed over the semiconductor material layer 9 that is located in the substrate 8.

According to an aspect of the present disclosure, thin film transistors (TFTs) may be subsequently formed in a metal interconnect level that overlies that metal interconnect levels that contain the lower-level dielectric layers (601, 610, 620) and the first metal interconnect structures (612, 618, 622, 628). In one embodiment, a planar dielectric layer having a uniform thickness may be formed over the lower-level dielectric layers (601, 610, 620). The planar dielectric layer is herein referred to as an insulating material layer 635. The insulating material layer 635 includes a dielectric material such as undoped silicate glass, a doped silicate glass, organosilicate glass, or a porous dielectric material, and may be deposited by chemical vapor deposition. The thickness of the insulating material layer 635 may be in a range from 20 nm to 300 nm, although lesser and greater thicknesses may also be used.

Generally, interconnect-level dielectric layers (such as the lower-level dielectric layer (601, 610, 620)) containing therein the metal interconnect structures (such as the first metal interconnect structures (612, 618, 622, 628)) may be formed over semiconductor devices. The insulating material layer 635 may be formed over the interconnect-level dielectric layers.

In one embodiment, the substrate 8 may comprise a single crystalline silicon substrate, and lower-level dielectric layers (601, 610, 620) embedding lower-level metal interconnect structures (612, 618, 622, 628) may be located above the single crystalline silicon substrate. Field effect transistors 701 including a respective portion of the single crystalline silicon substrate as a channel may be embedded within the lower-level dielectric layers (601, 610, 620). The field effect transistors may be subsequently electrically connected to at least one of a gate electrode, a source electrode, and a drain electrode of one or more, or each, of thin film transistors to be subsequently formed.

An etch stop dielectric layer 636 may be optionally formed over the insulating material layer 635. The etch stop dielectric layer 636 includes an etch stop dielectric material providing higher etch resistance to an etch chemistry during a subsequently anisotropic etch process that etches a dielectric material to be subsequently deposited over the etch stop dielectric layer 636. For example, the etch stop dielectric layer 636 may include silicon carbide nitride, silicon nitride, silicon oxynitride, or a dielectric metal oxide such as aluminum oxide. The thickness of the etch stop dielectric layer 636 may be in a range from 2 nm to 40 nm, such as from 4 nm to 20 nm, although lesser and greater thicknesses may also be used.

Referring to FIGS. 2A-2C, a region of the first exemplary structure is illustrated, which corresponds to an area in which a thin film transistor is to be subsequently formed. While the present disclosure is described using a single instance of a thin film transistor, it is understood that multiple instances of the thin film transistor may be simultaneously formed in any of the exemplary structures of the present disclosure.

An insulating layer 42 may be formed over the insulating material layer 635 and the optional etch stop dielectric layer 636. The insulating layer 42 includes a dielectric material such as undoped silicate glass, a doped silicate glass, organosilicate glass, or a porous dielectric material, and may be deposited by chemical vapor deposition. The thickness of the insulating layer 42 may be in a range from 20 nm to 300 nm, although lesser and greater thicknesses may also be used. Multiple thin film transistors may be subsequently formed over the insulating layer 42. In one embodiment, the multiple thin film transistors may be arranged along a first horizontal direction hd1 and a second horizontal direction hd2, which may be perpendicular to the first horizontal direction hd1.

Referring to FIGS. 3A-3C, a photoresist layer (not shown) may be applied over a top surface of the insulating layer 42, and may be lithographically patterned to form an opening within the illustrated area. In one embodiment, the opening may be a rectangular opening having a pair of widthwise sidewalls along the first horizontal direction and having a pair of lengthwise sidewalls along the second horizontal direction hd2. An anisotropic etch process may be performed to transfer the pattern of the openings in the photoresist layer into an upper portion of the insulating layer 42. A recess region 11 may be formed in an upper portion of the insulating layer 42. The recess region 11 is also referred to as a bottom gate trench.

In one embodiment, the width of the recess region 11 along the first horizontal direction hd1 may be in a range from 20 nm to 300 nm, although lesser and greater widths may also be used. In one embodiment, the length of the recess region 11 along the second horizontal direction hd2 may be in a range from 30 nm to 3,000 nm, although lesser and greater lengths may also be used. The depth of the recess region 11 may be the same as the thickness of the insulating layer 42. Thus, a top surface of the optional etch stop dielectric layer 636 or a top surface of the insulating material layer 635 (in embodiments in which the etch stop dielectric layer 636 is not used). The photoresist layer may be subsequently removed, for example, by ashing.

Referring to FIGS. 4A-4C, at least one conductive material may be deposited in the recess region 11. The at least one conductive material may include, for example, a metallic barrier liner material (such as TiN, TaN, and/or WN) and a metallic fill material (such as Cu, W, Mo, Co, Ru, etc.). Other suitable metallic liner and metallic fill materials within the contemplated scope of disclosure may also be used. Excess portions of the at least one conductive material may be removed from above the horizontal plane including the top surface of the insulating layer 42 by a planarization process, which may include a chemical mechanical polishing (CMP) process and/or a recess etch process. The planarization process may use a chemical mechanical polishing process or a recess etch process. A bottom gate electrode 15 may be formed in the recess region 11 from the at least one conductive material deposited in the recess region 11. The bottom gate electrode 15 may be the only electrode of a transistor to be subsequently formed, or may be one of two gate electrodes of a transistor in embodiments in which a top gate electrode is subsequently formed. The top surface of the bottom gate electrode 15 may be located within a same horizontal plane as the top surface of the insulating layer 42. In some embodiments a chemical mechanical polish (CMP) process may be performed to render the top surface of the bottom gate electrode 15 and the top surface of the insulating layer 42 to be co-planar.

Figure 5C:
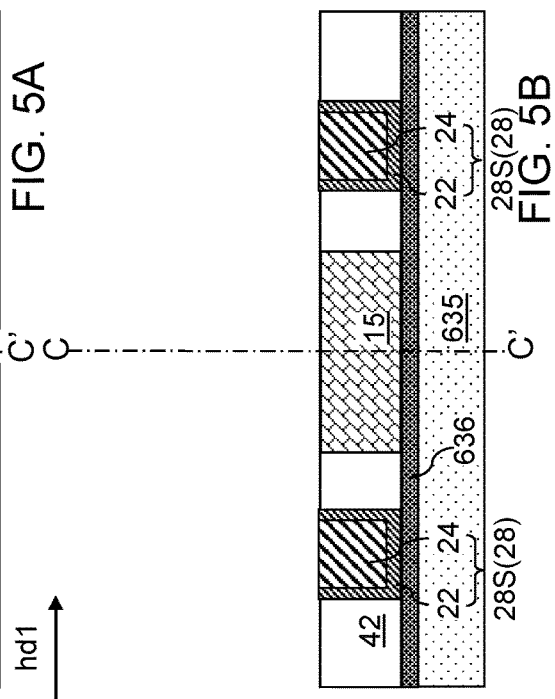
FIG. 5C is a vertical cross-sectional view of the first exemplary structure along the vertical plane C-C' of FIG. 5A.
Figure 5A:
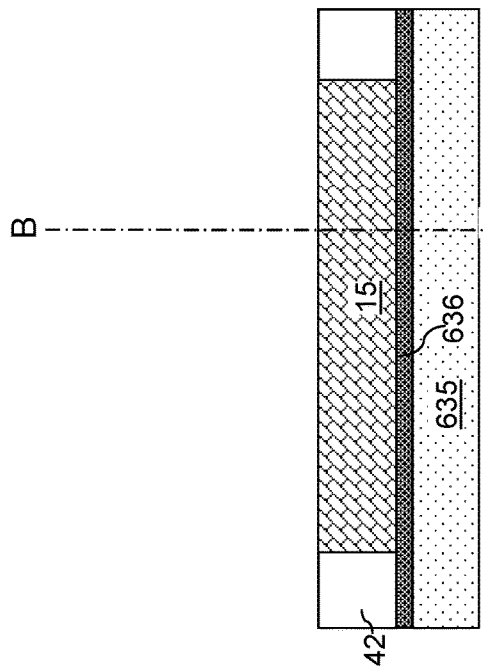
FIG. 5A is a top-down view of a region of the first exemplary structure after formation of a pair of bottom contact electrodes according to the first embodiment of the present disclosure.
Figure 5B:
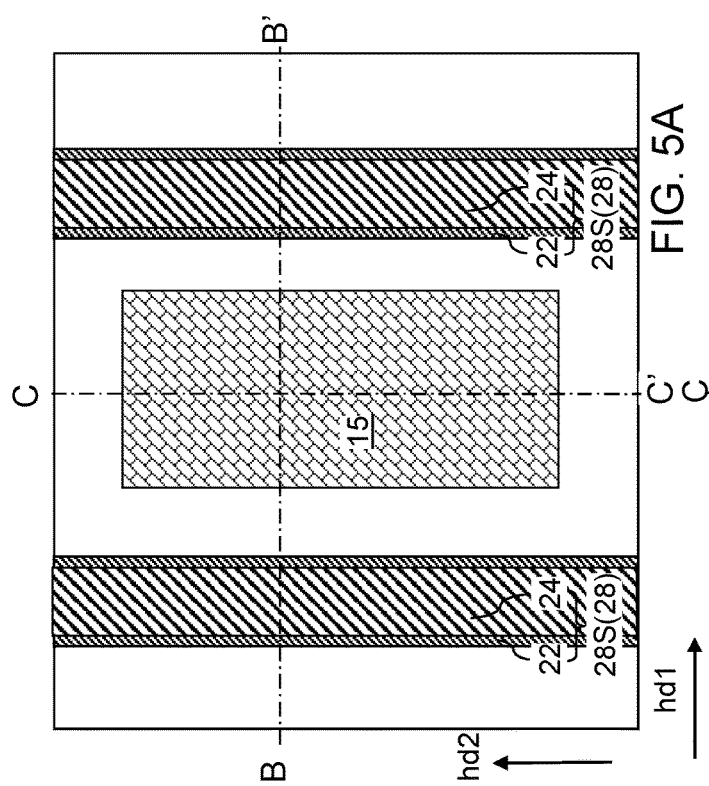
FIG. 5B is a vertical cross-sectional view of the first exemplary structure along the vertical plane B-B' of FIG. 5A.

Referring to FIGS. 5A-5C, line trenches laterally extending along the second horizontal direction hd2 may be formed through the insulating layer 42, for example, by applying a photoresist layer (not shown) over the insulating layer 42, lithographically patterning the photoresist layer to form line-shaped openings therein, and by transferring the pattern of the line-shaped openings through the insulating layer 42 using an anisotropic etch process. The line trenches may have a uniform width along the first horizontal direction hd1, and may be laterally spaced apart along the first horizontal direction by the bottom gate electrode 15. Each of the line trenches may be laterally offset from the bottom gate electrode 15 by a respective lateral spacing, which may be the same to provide a symmetrical configuration. The photoresist layer may be subsequently removed, for example, by ashing.

At least one conductive material may be deposited in the line trenches and over the insulating layer 42. The at least one conductive material may include an optional metallic liner material and a metallic fill material. In one embodiment, the at least one conductive material may consist of at least one metallic material. The optional metallic liner material, if present, may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the insulating layer 42 by a planarization process, which may use a CMP process and/or a recess etch process. Other suitable planarization processes may be used. Each remaining portion of the at least one conductive material filling a line trench constitutes a bottom contact electrode 28. A pair of bottom contact electrodes 28 may be formed in the insulating layer 42. In one embodiment, the pair of bottom contact electrodes 28 may be a pair of source electrodes 28S. Alternatively, the pair of bottom contact electrodes 28 may be a pair of drain electrodes. In one embodiment, each bottom contact electrode may include an optional metallic layer 22 that is a remaining portion of the metallic liner material, and an electrode fill material portion 24 that is a remaining portion of the metallic fill material. In one embodiment, the metallic layer 22 may comprise a metallic barrier liner that blocks diffusion of gaseous species.

Generally, a pair of bottom contact electrodes 28 and a bottom gate electrode 15 may be formed in the insulating layer 42. The pair of bottom contact electrodes 28 may be laterally spaced apart along the first horizontal direction hd1 by the bottom gate electrode 15. In one embodiment, the lateral dimension of the gate electrode 15 along the first horizontal direction hd1 may be in a range from 20 nm to 1,000 nm, such as from 40 nm to 500 nm, although lesser and greater lateral dimensions may also be used. In one embodiment, the lateral dimension of the gate electrode 15 along the second horizontal direction hd2 may be in a range from 50 nm to 5,000 nm, such as from 100 nm to 1,000 nm, although lesser and greater dimensions may also be used. In one embodiment, the width of each bottom contact electrode 28 along the first horizontal direction hd1 may be in a range from 5 nm to 1,000 nm, such as from 20 nm to 500 nm, although lesser and greater lateral dimensions may also be used. The length of the bottom contact electrodes 28 along the second horizontal direction hd2 may be greater than the lateral dimension of the bottom gate electrode 15 along the second horizontal direction hd2. In one embodiment, the bottom contact electrodes 28 may be formed as portions of two metal lines including a plurality of bottom contact electrodes 28 for a plurality of field effect transistors that are arranged in a row along the second horizontal direction hd2. The lateral spacing between the bottom gate electrode 15 and the bottom contact electrodes 28 may be in a range from 5 nm to 1,000 nm, such as from 20 nm to 500 nm, although lesser and greater lateral spacings may also be used.

Referring to FIGS. 6A-6C, the area between the pair of bottom contact electrodes 28 may be optionally recessed, for example, by applying a photoresist layer (not shown) over the first exemplary structure, forming an opening in the area between the pair of bottom contact electrodes 28, and vertically recessing the top surfaces of the bottom gate electrode 15 and an unmasked portion of the insulating layer 42 (i.e., the portion of the insulating layer 42 located within the area of the opening in the photoresist layer). At least one isotropic etch process (such as at least one wet etch process) and/or at least one anisotropic etch process (such as at least one reactive ion etch process) may be performed to vertically recess the top surface of the bottom gate electrode 15 and unmasked portions of the insulating layer 42. The recess depth may be the same as, or may be about the same as, the thickness of a bottom gate dielectric to be subsequently formed. The photoresist layer may be subsequently removed, for example, by ashing. The processing steps of FIGS. 6A-6C are optional, and may be omitted.

Referring to FIGS. 7A-7C, a bottom gate dielectric 10 may be formed on the top surface of the bottom gate electrode 15 by depositing a bottom gate dielectric layer and patterning the bottom gate dielectric layer. For example, the bottom gate dielectric layer may be deposited over the insulating layer 42 and the bottom gate electrode 15 as a continuous material layers The bottom gate dielectric layer may be formed by deposition of at least one gate dielectric material. The gate dielectric material may include, but is not limited to, silicon oxide, silicon oxynitride, silicon nitride, a high-k dielectric metal oxide (such as aluminum oxide, hafnium oxide, yttrium oxide, zirconium oxide, lanthanum oxide, etc.), or a stack thereof. High-k dielectric materials refers to dielectric materials having a dielectric constant greater than 7.9. Other suitable dielectric materials are within the contemplated scope of disclosure. The gate dielectric material may be deposited by atomic layer deposition or chemical vapor deposition. The thickness of the bottom gate dielectric layer may be in a range from 1 nm to 12 nm, such as from 2 nm to 6 nm, although lesser and greater thicknesses may also be used.

A photoresist layer (not shown) may be applied over the bottom gate dielectric layer, and may be lithographically patterned to cover a continuous area extending between the bottom contact electrodes 28. In one embodiment, a patterned portion of the photoresist layer may have straight edges that laterally extend along the second horizontal direction hd2 and overlie a peripheral region of a top surface of a respective one of the bottom contact electrodes 28 that is proximal to the bottom gate electrode 15. An etch process may be performed to remove unmasked portions of the bottom gate dielectric layer. A remaining portion of the bottom gate dielectric layer comprises a bottom gate dielectric 10. A portion of the bottom gate electrode 15 having an areal overlap with an active region to be subsequently formed may be covered by the bottom gate dielectric 10. A portion of the top surface of the bottom gate electrode 15 located outside the area of the active region to be subsequently formed may, or may not, be covered with the bottom gate dielectric. In one embodiment, the bottom gate dielectric 10 may have a rectangular area in a plan view (such as the top-down view of FIG. 7A). Generally, the bottom gate electrode 15 may be covered by the bottom gate dielectric 10, and a predominant portion of each top surface of the pair of bottom contact electrodes 28 may be physically exposed upon patterning the bottom gate dielectric layer. As used herein, a predominant portion of a structural element may refer to a portion that is at least 50% of the entirety of the structural element.

In one embodiment, the bottom surface of the bottom gate dielectric 10 may be located below the horizontal plane that includes the top surfaces of the bottom contact electrodes 28. In one embodiment, the bottom gate dielectric 10 contacts a respective sidewall of each of the pair of bottom contact electrodes 28. In one embodiment, the bottom gate dielectric 10 contacts a strip portion of a top surface of each of the bottom contact electrodes 28. In one embodiment, the thickness of the bottom gate dielectric 10 may be the same as, or may be substantially the same as, the recess distance of the bottom gate electrode 15 and the insulating layer 42. In such an embodiment, a top surface of portion of the bottom gate dielectric 10 that overlies the bottom gate electrode 15 may be located within, or about, the horizontal plane including the top surfaces of the bottom contact electrodes 28. In one embodiment, the bottom gate dielectric 10 may include a pair of vertically protruding strip portions that overlie a peripheral portion of a respective one of the bottom contact electrodes 28.

Referring to FIGS. 8A-8C, a continuous active layer may be deposited over the bottom gate dielectric 10 and the insulating layer 42, and may be patterned to form an active layer 20. In one embodiment, the active layer comprises a semiconducting metal oxide material providing electrical conductivity in a range from 1.0 S/m to $1.0 \times 10^5$ S/m upon suitable doping with electrical dopants (which may be p-type dopants or n-type dopants). Exemplary semiconducting metal oxide materials that may be used for the active layer 20 include, but are not limited to, quaternary compounds such as indium gallium zinc oxide (IGZO), indium tungsten zinc oxide, tin gallium zinc oxide, and tin tungsten zinc oxide, and ternary compounds such as indium gallium oxide, indium oxide tungsten, tin gallium oxide, and tin tungsten oxide. In one embodiment, the semiconducting metal oxide material of the active layer 20 may comprise a zinc-containing quaternary semiconducting compound such as indium gallium zinc oxide (IGZO), indium tungsten zinc oxide, tin gallium zinc oxide, or tin tungsten zinc oxide. In another embodiment, the semiconducting metal oxide material of the active layer 20 may comprise a ternary compound such as indium gallium oxide, indium oxide tungsten, tin gallium oxide, or tin tungsten oxide.

The active layer 20 may include an amorphous semiconducting metal oxide material. In one embodiment, the active layer 20 may be forming by depositing multiple repetitions of a unit layer stack deposition process. Each unit layer stack deposition process includes an acceptor-type oxide deposition process that deposits an oxide of an acceptor-type element selected from Ga and W in the form of an acceptor-type oxide layer, a post-transition metal oxide deposition process that deposits an oxide of a heavy post-transition metal element selected from In and Sn in the form of a post-transition metal oxide layer, and optionally includes a zinc oxide deposition process that deposits zinc oxide in the form of a zinc oxide layer. As used herein, post-transition metal elements refer to metal elements that are none of alkali metals, alkaline earth metals, outer transition metals, or inner transition metals (i.e., Lanthanides and Actinides). Thus, post-transition metal elements comprise aluminum, zinc, gallium, cadmium, indium tin, mercury, thallium, lead, bismuth, and polonium. Light post-transition metal elements comprise aluminum, zinc, and gallium. Heavy post-transition metal elements comprise cadmium, indium tin, mercury, thallium, lead, bismuth, and polonium.

Each acceptor-type oxide deposition process may comprise an atomic layer deposition process. Each post-transition metal oxide deposition process may comprise an atomic layer deposition process. Each zinc oxide deposition process, if used, comprises an atomic layer deposition process. The thickness of the active layer 20 may be in a range from 3 nm to 100 nm, such as from 5 nm to 50 nm and/or from 10 nm to 30 nm, although lesser and greater thicknesses may also be used.

In one embodiment, the average material composition of the active layer 20 may be $M_\alpha A_\beta Zn_\gamma O$, in which M is a heavy post-transition metal element such as indium or tin, A is an acceptor-type element such as gallium or tungsten, $\alpha$ is in a range from 0.25 to 0.50, $\tau 3$ is in a range from 0.12 to 0.25, and $\gamma$ is in a range from 0.25 to 0.50. Alternatively, the average material composition of the active layer 20 may be $M_\varepsilon A_\eta O$, in which M is a heavy post-transition metal element such as indium or tin, A is an acceptor-type element such as gallium or tungsten, $\varepsilon$ is in a range from 0.30 to 0.70, and $\eta$ is in a range from 0.15 to 0.40.

The patterning of the continuous active layer into the active layer 20 may be performed, for example, by applying and lithographically patterning a photoresist layer (not shown) over the continuous active layer, and by transferring the pattern in the photoresist layer through the continuous active layer by performing an etch process such as an anisotropic etch process. In one embodiment, portions of the bottom gate dielectric 10 that are not masked by the photoresist layer may be removed so that the area of the bottom gate dielectric 10 may be less than the area of the active layer 20. In one embodiment, a pair of sidewalls of the bottom gate dielectric 10 that laterally extend along the first horizontal direction hd1 may be vertically coincident with a pair of sidewalls of the active layer 20 that laterally extend along the first horizontal direction hd1. Peripheral regions of the bottom surface of the active layer 20 contact top surfaces of the bottom contact electrodes 28. A center portion of the bottom surface of the active layer 20 contacts a top surface of the bottom gate dielectric 10. The photoresist layer may be removed, for example, by ashing.

Generally, the active layer 20 may be formed on the bottom gate dielectric 10 and on top surfaces of the pair of bottom contact electrodes 28. A first surface of the active layer 20, such as the bottom surface of the active layer 20, contacts the bottom gate dielectric 10 and the pair of bottom contact electrodes 28. In embodiments in which the bottom gate dielectric 10 comprises a pair of upward-protruding strip portions overlying peripheral portions of the pair of bottom contact electrodes 28, the top surface of the active layer 20 may comprise a pair of upward-protruding strip portions overlying the upward-protruding strip portions of the bottom gate dielectric 10. See e.g., FIG. 8B.

Figure 9C:
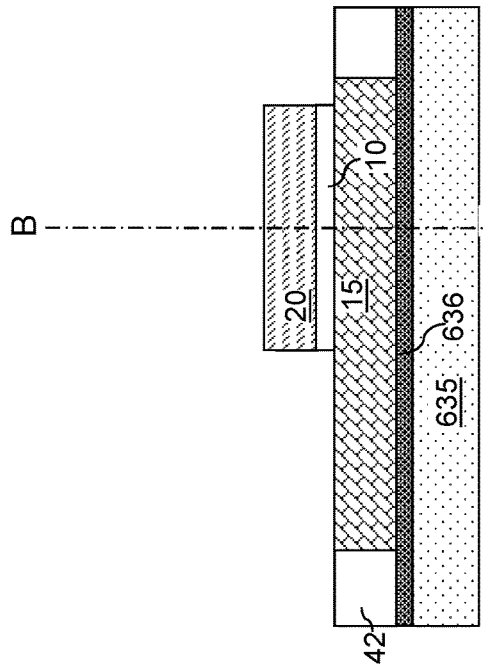
FIG. 9C is a vertical cross-sectional view of the first exemplary structure along the vertical plane C-C' of FIG. 9A.
Figure 9A:
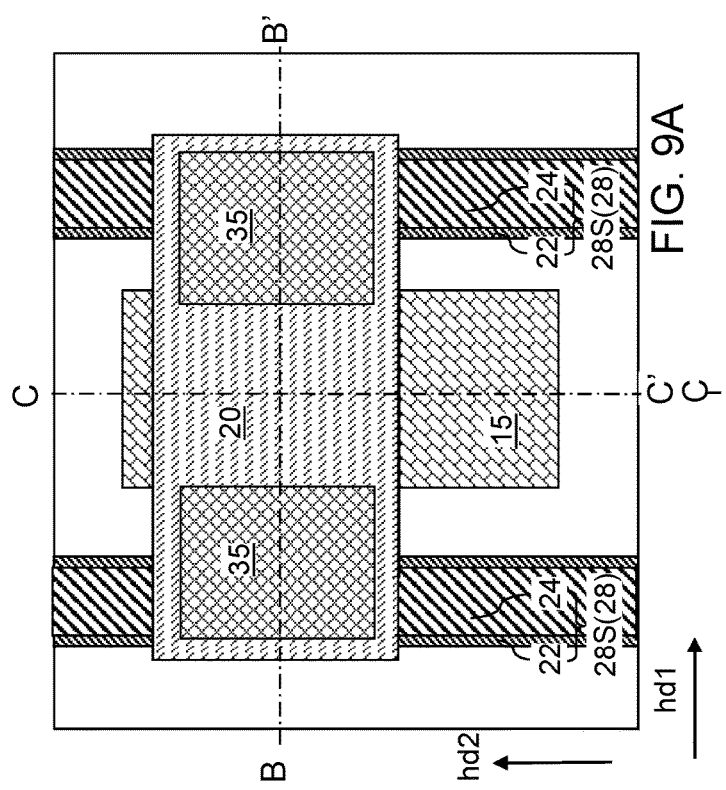
FIG. 9A is a top-down view of a region of the first exemplary structure after formation of a pair of top gate stacks according to the first embodiment of the present disclosure.
Figure 9B:
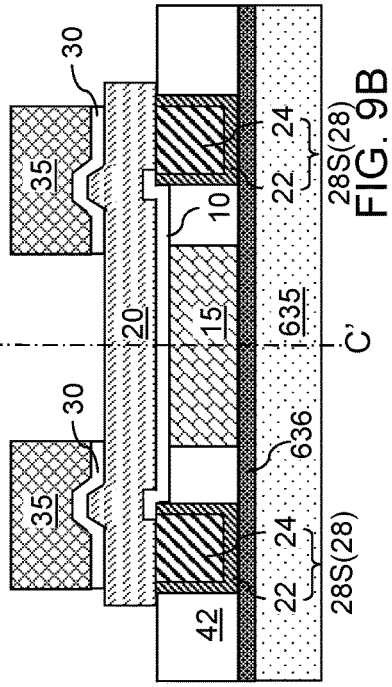
FIG. 9B is a vertical cross-sectional view of the first exemplary structure along the vertical plane B-B' of FIG. 9A.

Referring to FIGS. 9A-9C, a top gate dielectric layer may be deposited over the active layer 20. The top gate dielectric layer may be formed by deposition of at least one gate dielectric material. The gate dielectric material may include, but is not limited to, silicon oxide, silicon oxynitride, a high-k dielectric metal oxide (such as aluminum oxide, hafnium oxide, yttrium oxide, zirconium oxide, lanthanum oxide, etc.), or a stack thereof. Other suitable dielectric materials are within the contemplated scope of disclosure. The top gate dielectric material may be deposited by atomic layer deposition or chemical vapor deposition. The thickness of the top gate dielectric layer may be in a range from 1 nm to 12 nm, such as from 2 nm to 6 nm, although lesser and greater thicknesses may also be used.

At least one conductive material layer may be deposited over the top gate dielectric layer to form a top gate electrode 35 layer. The at least one conductive material may include, for example, a combination of a metallic barrier liner material (such as TiN, TaN, and/or WN) and a metallic fill material (such as Cu, W, Mo, Co, Ru, etc.). Other suitable metallic liner and metallic fill materials within the contemplated scope of disclosure may also be used. The thickness of the top gate electrode layer, as measured above the active layer 20, may be in a range from 30 nm to 300 nm, such as from 60 nm to 150 nm, although lesser and greater thicknesses may also be used.

A photoresist layer (not shown) may be applied over the at least one conductive material layer, and may be lithographically patterned to form a pair of discrete photoresist material portions that are laterally spaced apart along the first horizontal direction hd1. In one embodiment, the pair of discrete photoresist material portions may have a respective rectangular horizontal cross-sectional shape. In one embodiment, each of the discrete photoresist material portions may comprise a peripheral portion having an areal overlap with a respective peripheral region of the bottom gate dielectric 15 in a plan view. In one embodiment, each overlap area between the discrete photoresist material portion and the bottom gate electrode 15 may have a rectangular strip shape that laterally extends along the second horizontal direction hd2. The pattern in the photoresist material portions may be transferred through the top gate electrode layer and the top gate dielectric layer by performing an anisotropic etch process. In one embodiment, the anisotropic etch process may be selective to the material of the top gate dielectric layer. Each patterned portion of the top gate electrode layer constitutes a top gate electrode 35.

Optionally, unmasked portions of the top gate dielectric layer may be subsequently removed by an etch process, which may comprise an anisotropic etch process (such as a reactive ion etch process) or an isotropic etch process (such as a wet etch process). Each patterned portion of the top gate dielectric layer constitutes a top gate dielectric 30. The photoresist layer may be subsequently removed, for example, by ashing.

A pair of top gate stacks (30, 35) may be formed over the active layer 20. Each the top gate electrode 35 straddles the active layer 20 along the second horizontal direction hd2. The height of each top gate electrode 35, as measured in a region overlying the active layer 20 between a bottom surface and a top surface of the respective top gate electrode 35, may be in a range from 30 nm to 300 nm, such as from 60 nm to 150 nm, although lesser and greater heights may also be used.

Generally, a top gate dielectric layer and a top gate electrode layer over the active layer may be deposited over the active layer 20, and may be subsequently patterned into a pair of top gate stacks (30, 35). Each of the pair of top gate stacks (30, 35) comprises a respective top gate dielectric 30 and a respective top gate electrode 35. In one embodiment, within each stack of the top gate dielectric 30 and the top gate electrode 35, the top gate dielectric 30 may have a same lateral extent as the top gate electrode 35 in a plan view along a direction that is perpendicular to a top surface of the substrate 8 (such as the top-down view of FIG. 9A).

In one embodiment, each of the pair of top gate stacks (30, 35) may have an areal overlap with a respective peripheral portion of the first gate electrode (10, 15) in a plan view along a direction that is perpendicular to a top surface of the substrate 8. In one embodiment, each of the pair of first contact electrodes 28 has an areal overlap with a respective one of the pair of top gate stacks (30, 35) in the plan view. In one embodiment, each of the top gate dielectrics 30 may comprise a respective bottom surface including a vertically raised portion that overlies and contacts a respective upward-protruding strip portion of the top surface of the active layer 20.

Referring to FIGS. 10A-10C, a dielectric layer 48 may be deposited over the top gate electrodes 35 and the top gate dielectrics 30. The dielectric layer 48 is also referred to as an electrode-level dielectric layer. The dielectric layer 48 includes a dielectric material such as undoped silicate glass, a doped silicate glass, organosilicate glass, or a stack thereof. In some embodiments, the dielectric layer 48 and insulating layer 42 may be formed of different dielectric materials. In other embodiments, the dielectric layer 48 and insulating layer 42 may be formed of the same dielectric material. Optionally, the dielectric layer 48 may be planarized to provide a flat top surface. The dielectric material of the dielectric layer 48 may be planarized so that a planarized horizontal top surface of the dielectric layer 48 is formed within the horizontal plane including the top surfaces of the top gate electrodes 35. The set of the insulating layer 42 and the dielectric layer 48 is herein referred to as a thin-film-transistor-level (TFT-level) dielectric layer 40, i.e., a dielectric layer that is located at the level of thin film transistors.

Referring to FIGS. 11A-11C, a photoresist layer (not shown) may be applied over the TFT-level dielectric layer 40, and may be lithographically patterned to form discrete openings therein. The pattern of the discrete openings in the photoresist layer may be transferred through the dielectric layer 48 by an anisotropic etch process to form a contact via cavity 59, and a bottom gate contact via cavity 19. The anisotropic etch process may etch the dielectric layer 48 selective to the material of the active layer 20 and selective to the material of the bottom gate electrode 15.

The contact via cavity 59 may be formed within the area of the active layer 20, and may be laterally spaced from the top gate stacks (30, 35) along the first horizontal direction hd1. A rectangular portion of the top surface of the active layer 20 may be physically exposed at the bottom of the contact via cavity 59. The bottom gate contact via cavity 19 may be formed within the area of the bottom gate electrode 15, and may be laterally spaced from the top gate stacks (30, 35) along both the first horizontal direction hd1 and the second horizontal direction hd2. A top surface of the bottom gate electrode 15 may be physically exposed at the bottom of the backside electrode contact via cavity 19. The photoresist layer may be subsequently removed, for example, by ashing.

Referring to FIGS. 12A-12C, at least one conductive material may be deposited in each of the cavities (19, 59) and over the TFT-level dielectric layer 40. The at least one conductive material may include an optional metallic liner material and a metallic fill material. In one embodiment, the at least one conductive material may consist of at least one metallic material. The optional metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric layer 40 by a planarization process, which may use a CMP process and/or a recess etch process. Other suitable planarization processes may be used. Each remaining portion of the at least one conductive material filling a contact via cavity 59 constitutes a top contact electrode 58. Each remaining portion of the at least one conductive material filling a backside electrode contact via cavity 19 constitutes a backside electrode contact via structure 18, which contacts a top surface of the bottom gate electrode 15.

In one embodiment, each top contact electrode 58 may include an optional metallic layer 52 that is a remaining portion of the metallic liner material, and an electrode fill material portion 54 that is a remaining portion of the metallic fill material. Each backside electrode contact via structure 18 may include a metallic layer 16 that is a remaining portion of the metallic liner material, and a bottom gate contact metallic fill material portion 17 that is a remaining portion of the metallic fill material. In one embodiment, the metallic layer 16 may comprise a metallic barrier liner that blocks diffusion of gaseous species.

Top surfaces of the top contact electrode 58, the top gate electrodes 35, and the bottom gate electrode contact via structure 18 may be located within (i.e., may be co-planar with) a horizontal plane including a top surface of the TFT-level dielectric layer 40.

Generally, the top contact electrode 58 may be formed on the active layer 20 between the pair of top gate stacks (30, 35) by forming a contact via cavity 59 through the dielectric layer 48 and filling the contact via cavity 59 with at least one conductive fill material. In one embodiment, the top contact electrode 58 has an areal overlap with the bottom gate stack (10, 15) in a plan view along a direction that is perpendicular to a top surface of the substrate 8. In one embodiment, the bottom gate electrode 15 has a greater lateral extent along the first horizontal direction hd1 than the top contact electrode 58.

In one embodiment, each of the pair of top gate electrodes 35 has an areal overlap with a respective peripheral portion of the bottom gate electrode 15 in a plan view along a direction that is perpendicular to a top surface of the substrate 8, such as the top-down view of FIG. 12A. In one embodiment, each of the pair of bottom contact electrodes 28 has an areal overlap with a respective one of the pair of top gate electrodes 35 in a plan view along a direction that is perpendicular to a top surface of the substrate.

In the first exemplary structure illustrated in FIGS. 12A-12C, the pair of bottom contact electrodes 28 may be formed as a pair of source electrodes 28S, and the top contact electrode 58 is formed as a drain electrode 58D.

Figure 13A:
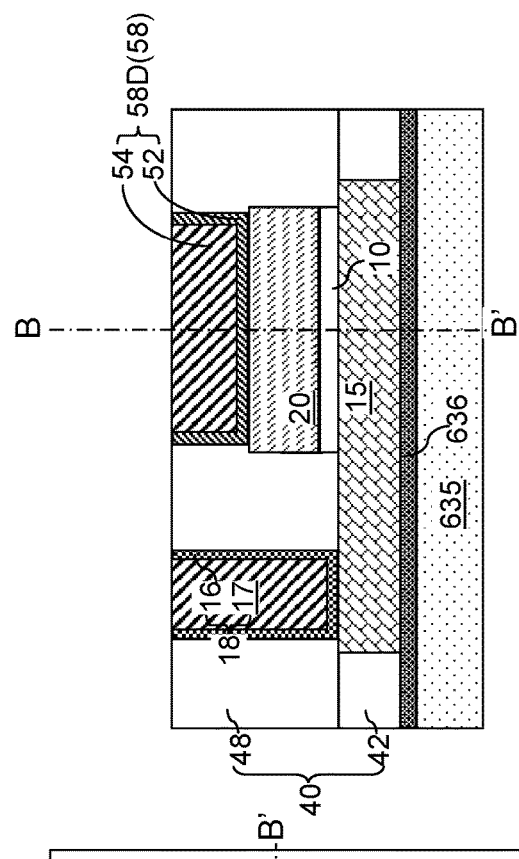
FIG. 13A is a top-down view of a region of a first alternative configuration of the first exemplary structure according to the first embodiment of the present disclosure.
Figure 13B:
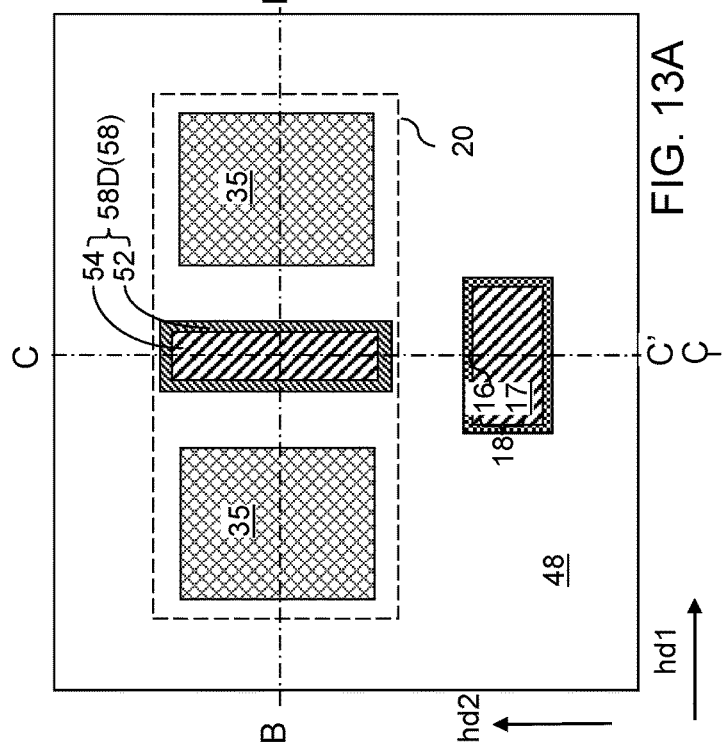
FIG. 13B is a vertical cross-sectional view of the first exemplary structure along the vertical plane B-B' of FIG. 13A.
Figure 13C:
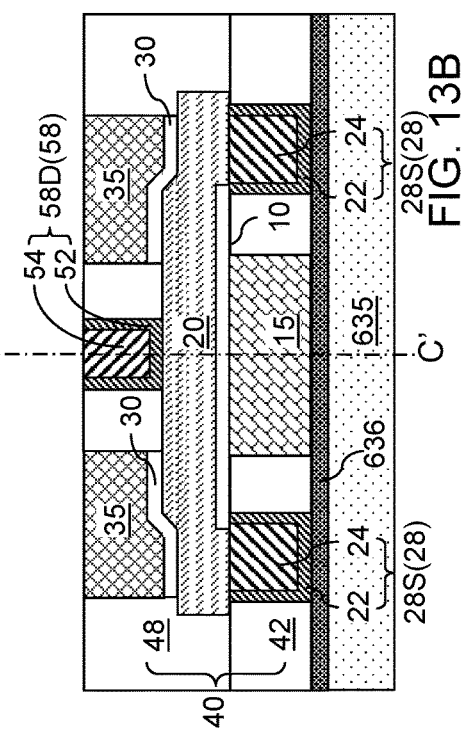
FIG. 13C is a vertical cross-sectional view of the first exemplary structure along the vertical plane C-C' of FIG. 13A.

Referring to FIGS. 13A-13C, a first alternative configuration of the first exemplary structure may be derived from the first exemplary structure of FIGS. 12A-12C by omitting the processing steps of FIGS. 6A-6C. In this case, the bottom surface of the bottom gate dielectric 10 may be coplanar with the top surfaces of the pair of bottom contact electrodes 28 and the insulating layer 42. The top surface of the active layer 20 may have steps that laterally extend along the second horizontal direction hd2 such that a portion of the active layer 20 that overlies the bottom gate dielectric 10 has a raised top surface than portions of the active layer 20 that are located outside the area of the bottom gate dielectric 10. The bottom surface of the bottom gate dielectric 10 may be located within a horizontal plane including interfaces between the pair of bottom contact electrodes 28 and the active layer 20. The bottom surface of the bottom gate dielectric 10 may contact a peripheral portion of a respective top surface of each of the pair of bottom contact electrodes 28.

Referring to FIGS. 14A-14C, a second alternative configuration of the first exemplary structure may be derived from the first exemplary structure of FIGS. 12A-12C by planarizing the bottom gate dielectric 10 after performing the processing steps of FIGS. 7A-7C and prior to performing the processing steps of FIGS. 8A-8C. For example, a chemical mechanical polishing process may be performed to remove protruding portions of the bottom gate dielectric 10. In this embodiment, the top surface of the bottom gate dielectric 10 may be coplanar with the top surfaces of the pair of bottom contact electrodes 28 and the topmost surface of the insulating layer 42. The entirety of the top surface of the active layer 20 may be planar.

Referring to FIGS. 15A-15C, a second exemplary structure according to a second embodiment of the present disclosure may be derived from the first exemplary structure of FIGS. 12A-12C by forming the pair of bottom contact electrodes 28 as a pair of drain electrodes 28D, and by forming the top contact electrode 58 as a source electrode 58S.

Referring to FIGS. 16A-16C, a first alternative configuration of the second exemplary structure according to the second embodiment of the present disclosure may be derived from the first alternative configuration of the first exemplary structure of FIGS. 13A-13C by forming the pair of bottom contact electrodes 28 as a pair of drain electrodes 28D, and by forming the top contact electrode 58 as a source electrode 58S.

Referring to FIGS. 17A-17C, a second alternative configuration of the second exemplary structure according to the second embodiment of the present disclosure may be derived from the second alternative configuration of the first exemplary structure of FIGS. 14A-14C by forming the pair of bottom contact electrodes 28 as a pair of drain electrodes 28D, and by forming the top contact electrode 58 as a source electrode 58S. The second alternative configuration of the second exemplary structure illustrates a configuration in which the top gate dielectrics 30 are not patterned in the same shape as the top gate electrodes 35. This configuration can be obtained by not transferring the pattern of the top gate electrodes 35 through the top gate dielectrics 30. In this case, a top gate dielectric material layer for forming the top gate dielectric 30 may be deposited over the semiconducting metal oxide material layer for forming the active layer 20, and the top gate dielectric material layer and the semiconducting metal oxide material layer can be patterned with a same horizontal cross-sectional shape, thereby forming a stack of the active layer 20 and the top gate dielectric 30. After deposition of a metallic material for forming the top gate electrodes 35, the metallic material can be anisotropically etched selective to the top gate dielectric 30. The configuration for the top gate dielectric 30 as illustrated in FIGS. 17A-17C may be employed for any of the previously described embodiments of the present disclosure.

Figure 18C:
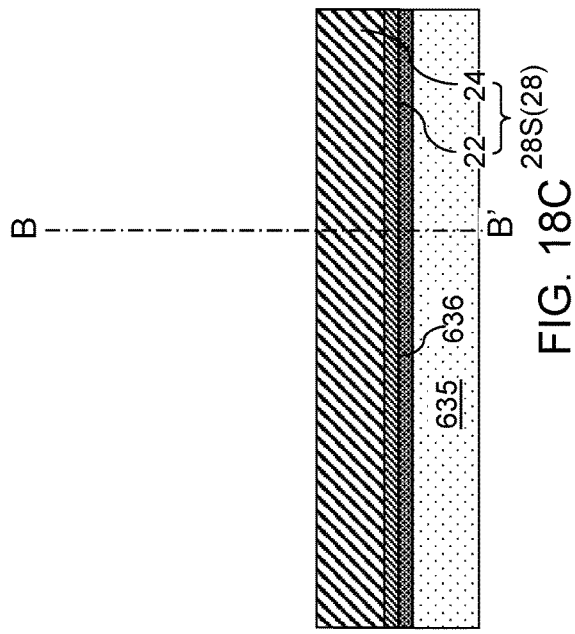
FIG. 18C is a vertical cross-sectional view of the third exemplary structure along the vertical plane C-C' of FIG. 18A.
Figure 18A:
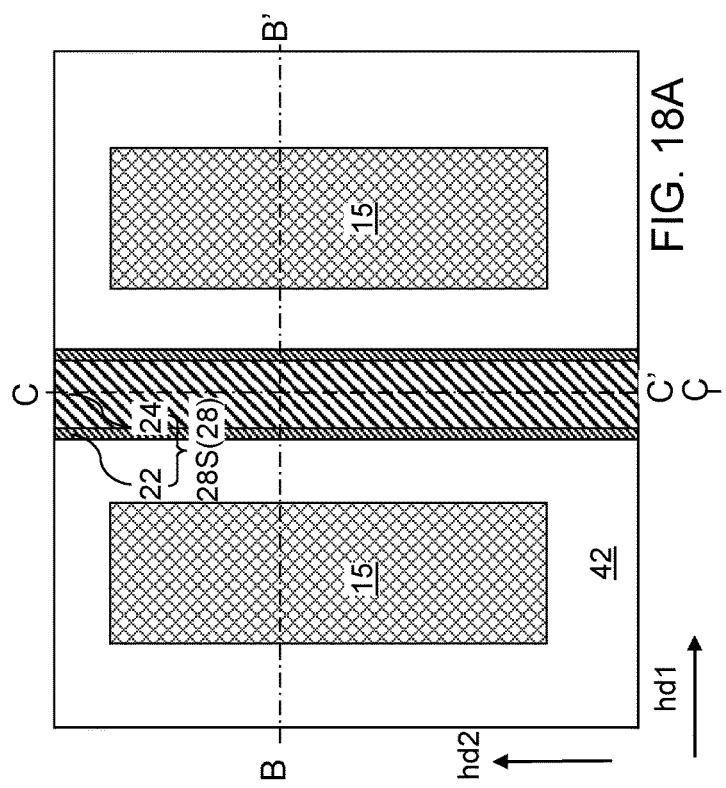
FIG. 18A is a top-down view of a region of a third exemplary structure after formation of a pair of bottom gate electrodes and a bottom contact electrode according to a third embodiment of the present disclosure.
Figure 18B:
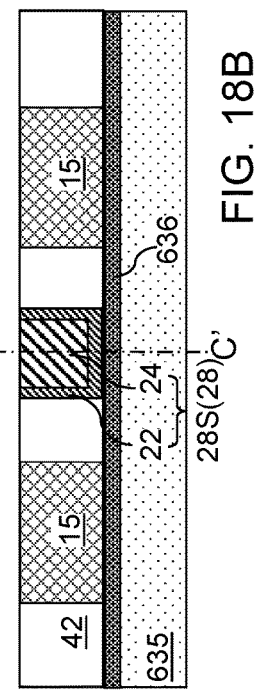
FIG. 18B is a vertical cross-sectional view of the third exemplary structure along the vertical plane B-B' of FIG. 18A.

Referring to FIGS. 18A-18C, a third exemplary structure according to the third embodiment of the present disclosure may be derived from the first exemplary structure illustrated in FIGS. 2A-2C by forming a bottom contact electrode 28 and a pair of bottom gate electrodes 15 in the insulating layer 42. The pair of bottom gate electrodes 15 may be laterally spaced apart along the first horizontal direction hd1 by the bottom contact electrode 28. Generally, the third exemplary structure illustrated in FIGS. 18A-18C may be formed by modifying the processing steps of FIGS. 3A-5C such that a pair of bottom gate electrodes 15 may be formed in lieu of a single bottom gate electrode 15 in the first exemplary structure, and a bottom contact electrode 28 may be formed in lieu of a pair of bottom contact electrodes 28 in the first exemplary structure. Patterns in the photoresist layers may be modified accordingly during the processing steps.

Referring to FIGS. 19A-19C, areas of the second exemplary structure other than the area of the bottom contact electrode 28 may be optionally recessed, for example, by applying a photoresist layer (not shown) over the second exemplary structure, patterning the photoresist layer to cover a predominant portion of the bottom contact electrode 28, and vertically recessing the top surfaces of the bottom gate electrode 15 and an unmasked portion of the insulating layer 42. At least one isotropic etch process (such as at least one wet etch process) and/or at least one anisotropic etch process (such as at least one reactive ion etch process) may be performed to vertically recess the top surface of the bottom gate electrodes 15 and unmasked portions of the insulating layer 42. The recess depth may be the same as, or may be about the same as, the thickness of a bottom gate dielectric to be subsequently formed. The photoresist layer may be subsequently removed, for example, by ashing. The processing steps of FIGS. 19A-19C are optional, and may be omitted.

Referring to FIGS. 20A-20C, bottom gate dielectrics 10 may be formed on the top surfaces of the bottom gate electrode 15 and the bottom contact electrode 28 by depositing a bottom gate dielectric layer and patterning the bottom gate dielectric layer. For example, the bottom gate dielectric layer may be deposited over the insulating layer 42 and the bottom gate electrode 15 as a continuous material layers The bottom gate dielectric layer may be formed by deposition of at least one gate dielectric material. The material composition and the thickness of the bottom gate dielectric layer may be the same as in the first embodiment.

A photoresist layer (not shown) may be applied over the bottom gate dielectric layer, and may be lithographically patterned to cover the pair of bottom gate electrodes 15 without covering a predominant portion of the bottom contact electrode 28. In one embodiment, a patterned portion of the photoresist layer may have straight edges that laterally extend along the second horizontal direction hd2 and overlie a respective peripheral region of the bottom contact electrode 28. An etch process may be performed to remove unmasked portions of the bottom gate dielectric layer. Remaining portions of the bottom gate dielectric layer comprise a pair of bottom gate dielectrics 10. In one embodiment, the pair of bottom gate electrodes 15 may be entirely covered by the pair of bottom gate dielectrics 10, and a predominant portion of a top surface of the bottom contact electrode 28 may be physically exposed upon patterning the bottom gate dielectric layer. In one embodiment, the entirety of each bottom gate electrode 15, or at least a portion of each bottom gate electrode 15 having an areal overlap with an active region to be subsequently formed, is covered by a respective bottom gate dielectric 10. In one embodiment, each of the pair of bottom gate dielectrics 10 may have a rectangular area in a plan view (such as the top-down view of FIG. 20A).

In an embodiment, each of the bottom gate dielectrics 10 may contact the bottom contact electrode 28. In one embodiment, each of the bottom gate dielectrics 10 may have a respective bottom surface that is located below a horizontal plane including the top surface of the bottom contact electrode 28. In one embodiment, each of the bottom gate dielectrics 10 contacts a respective sidewall of the bottom contact electrode 28. In one embodiment, each of the bottom gate dielectrics 10 contacts a respective strip portion of a top surface of the bottom contact electrode 28.

In one embodiment, the thickness of the bottom gate dielectric 10 may be the same as, or may be substantially the same as, the recess distance of the bottom gate electrodes 15 and the insulating layer 42. In this case, a top surface of portion of each bottom gate dielectric 10 that overlies the bottom gate electrode 15 may be located within, or about, the horizontal plane including the top surfaces of the bottom contact electrodes 28. In one embodiment, the bottom gate dielectrics 10 may include a pair of vertically protruding strip portions that overlie a respective peripheral portion of the bottom contact electrode 28.

Referring to FIGS. 21A-21C, the processing steps of FIGS. 8A-8C may be performed to form an active layer 20 over, and directly on, the pair of bottom gate dielectrics 10 and the bottom contact electrode 28. The active layer 20 may have the same material composition and the same thickness as in the first embodiment (see description of FIG. 8A-8C above). A center portion of the bottom surface of the active layer 20 may contact a top surface of the bottom contact electrode 28. Peripheral portions of the bottom surface of the active layer 20 may contact a top surface of each of a respective one of the bottom gate dielectrics 10.

Generally, the active layer 20 may be formed on the pair of bottom gate dielectrics 10 and on a top surface of the bottom contact electrode 28. A first surface of the active layer 20, such as the top surface of the active layer 20, may be physically exposed. A second surface of the active layer 20, such as the bottom surface of the active layer 20, may contact the pair of bottom gate dielectrics 10 and the bottom contact electrode 28. In embodiments in which each of the bottom gate dielectrics 10 comprises an upward-protruding strip portions overlying a respective peripheral portion of the bottom contact electrode 28, the top surface of the active layer 20 may comprise a pair of upward-protruding strip portions overlying the upward-protruding strip portions of the bottom gate dielectrics 10.

Referring to FIGS. 22A-22C, the processing steps of FIGS. 9A-9C may be performed with a modification in the lithographic pattern such that a top gate stack (30, 35) may be formed in lieu of a pair of top gate stacks (30, 35) in the first exemplary structure. Each top gate stack (30, 35) comprises a vertical stack of a top gate dielectric 30 and a top gate electrode 35. In one embodiment, the top gate dielectric 30 of the third exemplary structure may have a same lateral extent as the top gate electrode 35 in a plan view along a direction that is perpendicular to a top surface of the substrate 8.

In one embodiment, the bottom contact electrode 28 may have an areal overlap with the top gate stack (30, 35) in a plan view along a direction that is perpendicular to a top surface of the substrate 8. In one embodiment, the top gate stack (30, 35) may have a greater lateral extent along the first horizontal direction hd1 than the bottom contact electrode 28. In one embodiment, each of the pair of bottom gate electrodes 15 may have an areal overlap with a respective peripheral portion of the top gate electrode 35 in a plan view along a direction that is perpendicular to a top surface of the substrate 8 (such as the top-down view of FIG. 22A).

Figure 23C:
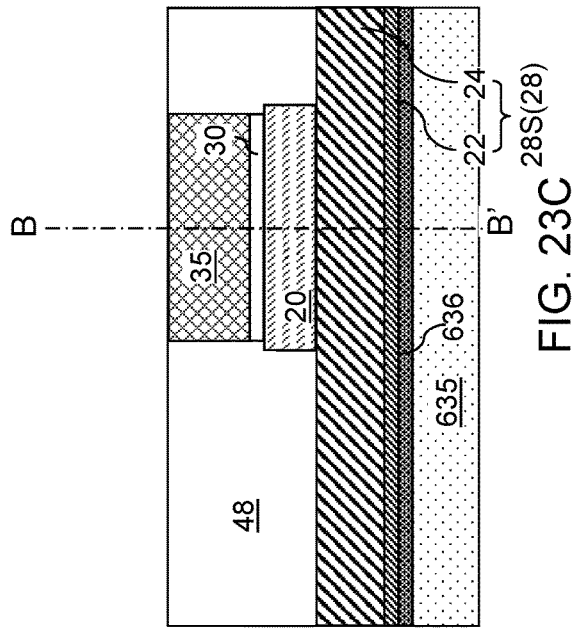
FIG. 23C is a vertical cross-sectional view of the third exemplary structure along the vertical plane C-C' of FIG. 23A.
Figure 23A:
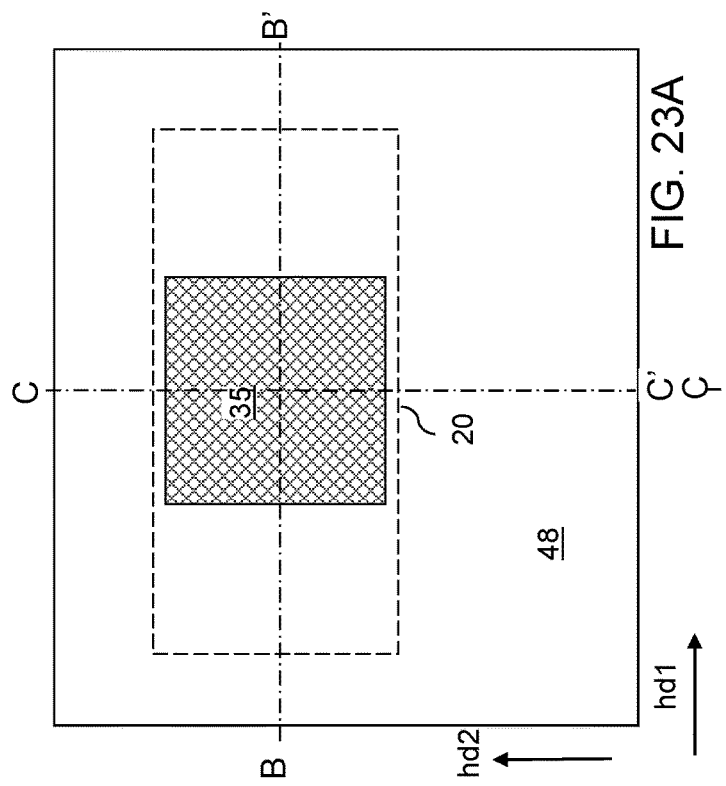
FIG. 23A is a top-down view of a region of the third exemplary structure after formation of a dielectric layer according to the third embodiment of the present disclosure.
Figure 23B:
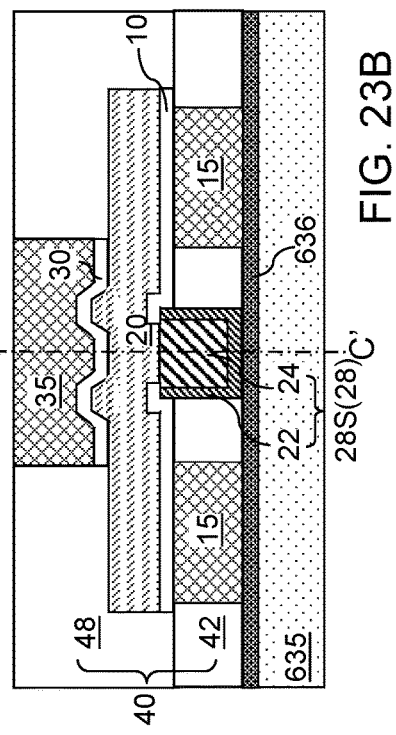
FIG. 23B is a vertical cross-sectional view of the third exemplary structure along the vertical plane B-B' of FIG. 23A.

Referring to FIGS. 23A-23C, a dielectric layer 48 may be deposited over the top gate electrode 35 and the top gate dielectric 30. The dielectric layer 48 is also referred to as an electrode-level dielectric layer. The dielectric layer 48 includes a dielectric material such as undoped silicate glass, a doped silicate glass, organosilicate glass, or a stack thereof. Optionally, the dielectric layer 48 may be planarized to provide a flat top surface. The dielectric material of the dielectric layer 48 may be planarized so that a planarized horizontal top surface of the dielectric layer 48 is formed within the horizontal plane including the top surface of the top gate electrode 35. The set of the insulating layer 42 and the dielectric layer 48 is herein referred to as a thin-film-transistor-level (TFT-level) dielectric layer 40, i.e., a dielectric layer that is located at the level of thin film transistors.

Referring to FIGS. 24A-24C, a photoresist layer (not shown) may be applied over the TFT-level dielectric layer 40, and may be lithographically patterned to form discrete openings therein. The pattern of the discrete openings in the photoresist layer may be transferred through the dielectric layer 48 by an anisotropic etch process to form a pair of contact via cavities 59, and a pair of bottom gate contact via cavities. The anisotropic etch process may etch the dielectric layer 48 selective to the material of the active layer 20 and selective to the material of the bottom gate electrodes 15.

The contact via cavities 59 may be formed within the area of a respective one of the bottom gate electrodes 15, and may be laterally spaced from the top gate stack (30, 35) along the first horizontal direction hd1. A rectangular portion of the top surface of the active layer 20 may be physically exposed at the bottom of each of the contact via cavities 59. A top surface of a bottom gate electrode 15 may be physically exposed at the bottom of each of the backside electrode contact via cavities. The photoresist layer may be subsequently removed, for example, by ashing.

Referring to FIGS. 25A-25C, at least one conductive material may be deposited in the cavities and over the TFT-level dielectric layer 40. The at least one conductive material may include an optional metallic liner material and a metallic fill material. In one embodiment, the at least one conductive material may consist of at least one metallic material. The optional metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric layer 40 by a planarization process, which may use a CMP process and/or a recess etch process. Other suitable planarization processes may be used. Each remaining portion of the at least one conductive material filling a contact via cavity 59 constitutes a top contact electrode 58. Each remaining portion of the at least one conductive material filling a backside electrode contact via cavity 19 constitutes a backside electrode contact via structure 18, which contacts a top surface of the bottom gate electrode 15.

In one embodiment, each top contact electrode 58 may include an optional metallic layer 52 that is a remaining portion of the metallic liner material, and an electrode fill material portion 54 that is a remaining portion of the metallic fill material. Each backside electrode contact via structure 18 may include an optional metallic layer 16 that is a remaining portion of the metallic liner material, and a bottom gate contact metallic fill material portion 17 that is a remaining portion of the metallic fill material.

Top surfaces of the top contact electrodes 58, the top gate electrodes 35, and the bottom gate electrode contact structures 18 may be located within (i.e., may be co-planar with) a horizontal plane including a top surface of the TFT-level dielectric layer 40.

Generally, a pair of the top contact electrodes 58 may be formed on the active layer 20 between the pair of top gate stacks (30, 35) by forming contact via cavities 59 through the dielectric layer 48 and filling the contact via cavities 59 with at least one conductive fill material. The pair of top contact electrodes 58 may be laterally spaced apart from each other along the first horizontal direction hd1 by the top gate stack (30, 35). In one embodiment, each of the top contact electrodes 58 has an areal overlap with a respective one of the bottom gate stacks (10, 15) in a plan view along a direction that is perpendicular to a top surface of the substrate 8. In one embodiment, the top gate electrode 35 has a greater lateral extent along the first horizontal direction hd1 than the bottom contact electrode 28.

In one embodiment, each of the pair of bottom gate electrodes 15 may have an areal overlap with a respective peripheral portion of the top gate electrode 35 in a plan view along a direction that is perpendicular to a top surface of the substrate 8, such as the top-down view of FIG. 25A. In one embodiment, each of the pair of top contact electrodes 58 has an areal overlap with a respective one of the pair of bottom gate electrodes 15 in a plan view along a direction that is perpendicular to a top surface of the substrate 8, such as the top-down view of FIG. 25A.

In the third exemplary structure illustrated in FIGS. 25A-25C, the bottom contact electrode 28 is formed as a source electrodes 28S, and the pair of top contact electrodes 58 is formed as a pair of drain electrodes 58D.

Referring to FIGS. 26A-26C, a first alternative configuration of the third exemplary structure may be derived from the third exemplary structure of FIGS. 25A-25C by omitting the processing steps of FIGS. 19A-19C. In this case, the bottom surfaces of the bottom gate dielectrics 10 may be coplanar with the top surfaces of the bottom contact electrode 28 and the insulating layer 42. The top surface of the active layer 20 may have steps that laterally extend along the second horizontal direction hd2 such that portions of the active layer 20 that overlie a respective bottom gate dielectric 10 have a raised top surface than a portion of the active layer 20 that is located between the areas of the bottom gate dielectrics 10. The bottom surfaces of the bottom gate dielectrics 10 may be located within a horizontal plane including interfaces between the bottom contact electrode 28 and the active layer 20. The bottom surface of the bottom gate dielectric 10 may contact a peripheral portion of a respective peripheral portion of the top surface of the bottom contact electrode 28.

Referring to FIGS. 27A-27C, a second alternative configuration of the third exemplary structure may be derived from the third exemplary structure of FIGS. 25A-25C by planarizing the bottom gate dielectrics 10 after performing the processing steps of FIGS. 20A-20C and prior to performing the processing steps of FIGS. 21A-21C. For example, a chemical mechanical polishing process may be performed to remove protruding portions of the bottom gate dielectrics 10. In this case, the top surfaces of the bottom gate dielectrics 10 may be coplanar with the top surface of the bottom contact electrode 28. The bottom surfaces of the bottom gate dielectrics 10 may be coplanar with the top surface of the insulating layer 42. In one embodiment, the entirety of the top surface of the active layer 20 may be planar. In an alternative configuration, top gate dielectric 30 may have a configuration illustrated in FIGS. 26A-26C, while the bottom gate dielectrics 10 have a configuration illustrated in FIGS. 27A-27C. In this case, the top gate dielectric 30 can be flat, i.e., may have a top surface contained entirely within a first horizontal plane and may have a bottom surface contained entirely within a second horizontal plane.

Referring to FIGS. 28A-28C, a fourth exemplary structure according to a fourth embodiment of the present disclosure may be derived from the third exemplary structure of FIGS. 25A-25C by forming the bottom contact electrode 28 as a drain electrode 28D, and by forming the pair of top contact electrodes 58 as a pair of source electrodes 58S.

Referring to FIGS. 29A-29C, a first alternative configuration of the fourth exemplary structure according to the fourth embodiment of the present disclosure may be derived from the first alternative configuration of the third exemplary structure of FIGS. 26A-26C by forming the bottom contact electrode 28 as a drain electrode 28D, and by forming the pair of top contact electrodes 58 as a pair of source electrodes 58S.

Referring to FIGS. 30A-30C, a second alternative configuration of the fourth exemplary structure according to the fourth embodiment of the present disclosure may be derived from the second alternative configuration of the third exemplary structure of FIGS. 27A-27C by forming the bottom contact electrode 28 as a drain electrode 28D, and by forming the pair of top contact electrodes 58 as a pair of source electrodes 58S.

Figure 31:
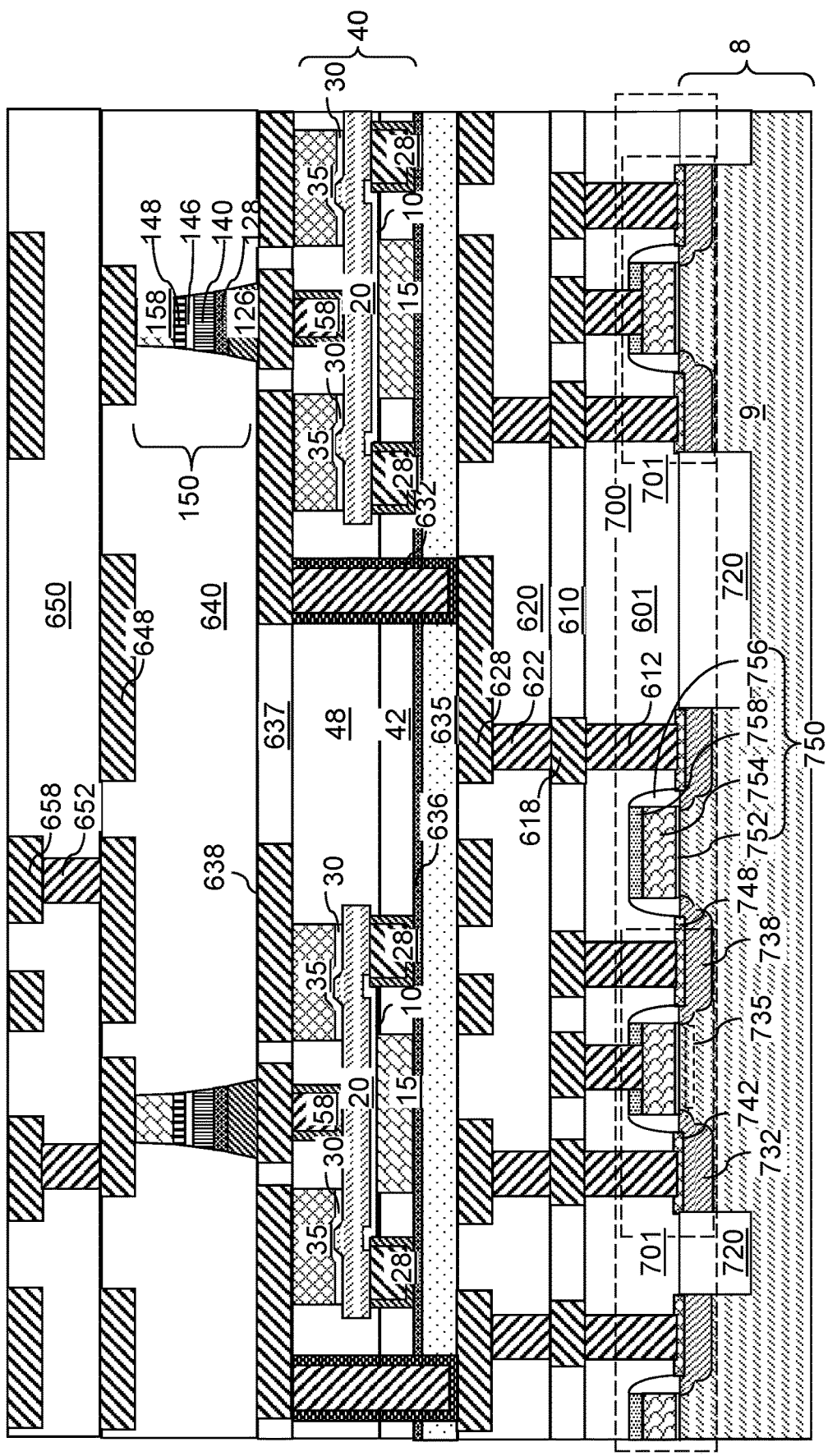
FIG. 31 is a vertical cross-sectional view of an exemplary structure after formation of memory cells according to an embodiment of the present disclosure.

Referring to FIG. 31, an exemplary structure is illustrated, which may be derived from any of the previously described exemplary structures by subsequently forming additional structures thereupon. In some embodiments, structures located underneath the bottom surface of the dielectric layer 42 may be replaced with the insulating material layer 635. For example, second metal via structures 632 may be formed may be formed through the TFT-level dielectric layer 40 and the insulating material layer 635 on a respective one of the second metal line structures 628 concurrent with, before, or after, formation of the at least one top contact electrode 58, the at least one top gate electrode 35, and the backside electrode contact via structures 18.

A dielectric layer, which is herein referred to as a third line-level dielectric layer 637, may be deposited over the TFT-level dielectric layer 40. Third metal line structures 638 may be formed in the third line-level dielectric layer 637 on a respective one of the metallic structures (58, 35, 18) embedded within the TFT-level dielectric layer 40.

Additional metal interconnect structures embedded in additional dielectric layers may be subsequently formed over the thin film transistors and the third line-level dielectric layer 637. In an illustrative example, the dielectric layers may include, for example, a fourth interconnect-level dielectric layer 640, a fifth interconnect-level dielectric layer 650, etc. The additional metal interconnect structures may include third metal via structures (not illustrated) and fourth metal lines 648 embedded in the fourth interconnect-level dielectric layer 640, fourth metal via structures 652 and fifth metal line structures 658 embedded in the fifth interconnect-level dielectric layer 650, etc.

Optionally, memory cells 150 may be formed below, above, or at the same level as, the thin film transistors. In embodiments in which the thin film transistors are formed as a two-dimensional periodic array, the memory cells 150 may be formed as a two-dimensional periodic array of memory cells 150. Each memory cell 150 may comprises a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., the bottom electrode) and the second electrode 158 (i.e., the top electrode).

In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnet (SAF) structure 140, a tunneling barrier layer 146, a free magnetization layer 148, and a second electrode 158. While the present disclosure is described using an embodiment in which the thin film transistors are used as access transistors for memory cells 150, embodiments are expressly contemplated herein in which the thin film transistors are used as logic devices, as components of a peripheral circuit for a memory array, or for any other semiconductor circuitry.

In one embodiment, the substrate 8 comprises a single crystalline silicon substrate. Lower-level dielectric layers (601, 610, 620) embedding lower-level metal interconnect structures (612, 618, 622, 628) may be located between the single crystalline silicon substrate and the insulating layer 42. Field effect transistors 701 including a respective portion of the single crystalline silicon substrate as a channel may be embedded within the lower-level dielectric layers (601, 610, 620), and may be electrically connected to at least one of the gate electrodes (15, 35), the bottom contact electrodes 28, and the top contact electrodes 58.

Figure 32:
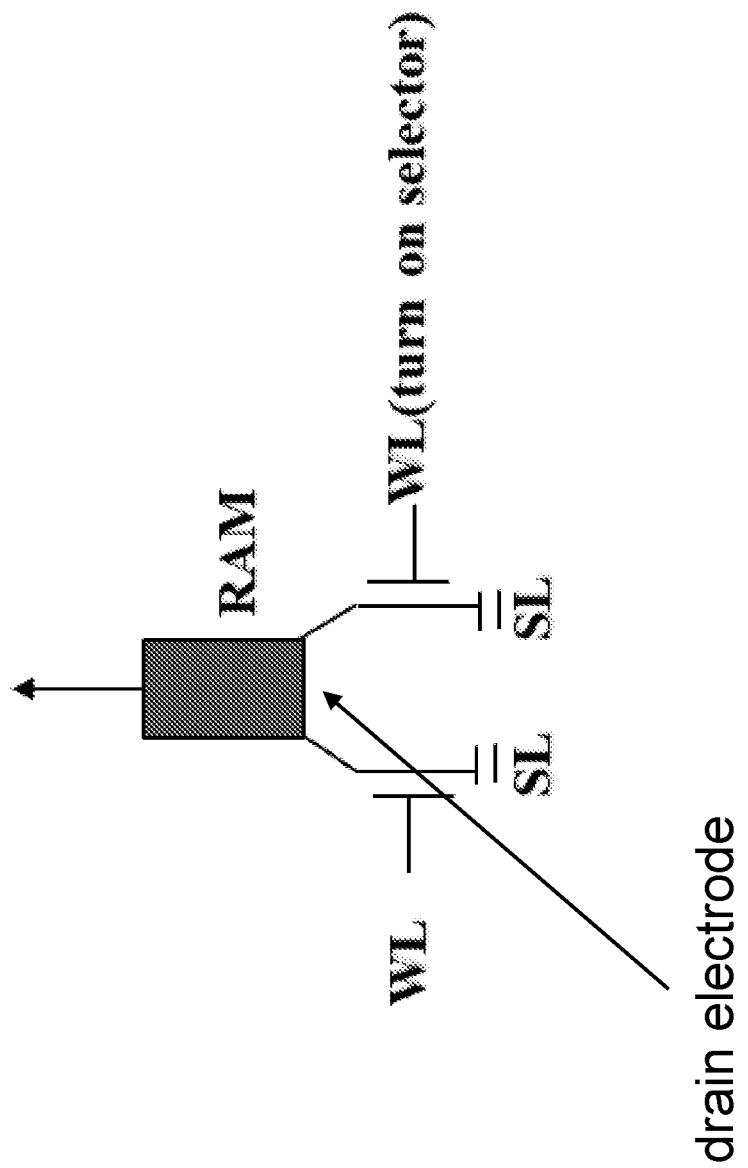
FIG. 32 is a circuit diagram of a device including a series connection of a field effect transistor and a memory element according to an aspect of the present disclosure.

Referring to FIG. 32, a circuit diagram illustrates a device including a series connection of a field effect transistor and a memory element (such as a random access memory (RAM) element) according to an aspect of the present disclosure. In this case, a field effect transistor of the present disclosure may be connected the RAM element such that a drain electrode (which may be embodied as a bottom contact electrode 28 in the first or second exemplary structure or as a top contact electrode 58 in the third or fourth exemplary structure) may be electrically connected to the RAM element, a pair of gate electrodes (which may be embodied as a pair of top gate electrodes 35 in the first or second exemplary structure or as a pair of bottom gate electrodes 15 in the third or fourth exemplary structure) may be connected to a pair of word lines, and a pair of source electrodes (which may be embodied as a pair of bottom contact electrodes 28 in the first or second exemplary structure or as a pair of top contact electrodes 58 in the third or fourth exemplary structure) may be connected to a pair of source lines. In this case, the field effect transistor may function as a selector switch that may be selected by activating either of the two word lines.

Generally, first contact electrodes of a field effect transistor may be connected to a pair of source lines, and a memory element may be electrically connected to a second contact electrode. The memory element may be configured to be activated upon application of a first activation signal to a first gate electrode and at least one second activation signal to any of a pair of second gate electrodes. For example, the memory element may be configured to be activated upon application of a first activation signal to a bottom gate electrode 15 and at least one second activation signal to any of a pair of top gate electrodes 35, or may be configured to be activated upon application of a first activation signal to a top gate electrode 35 and at least one second activation signal to any of a pair of bottom gate electrodes 15.

Figure 33:
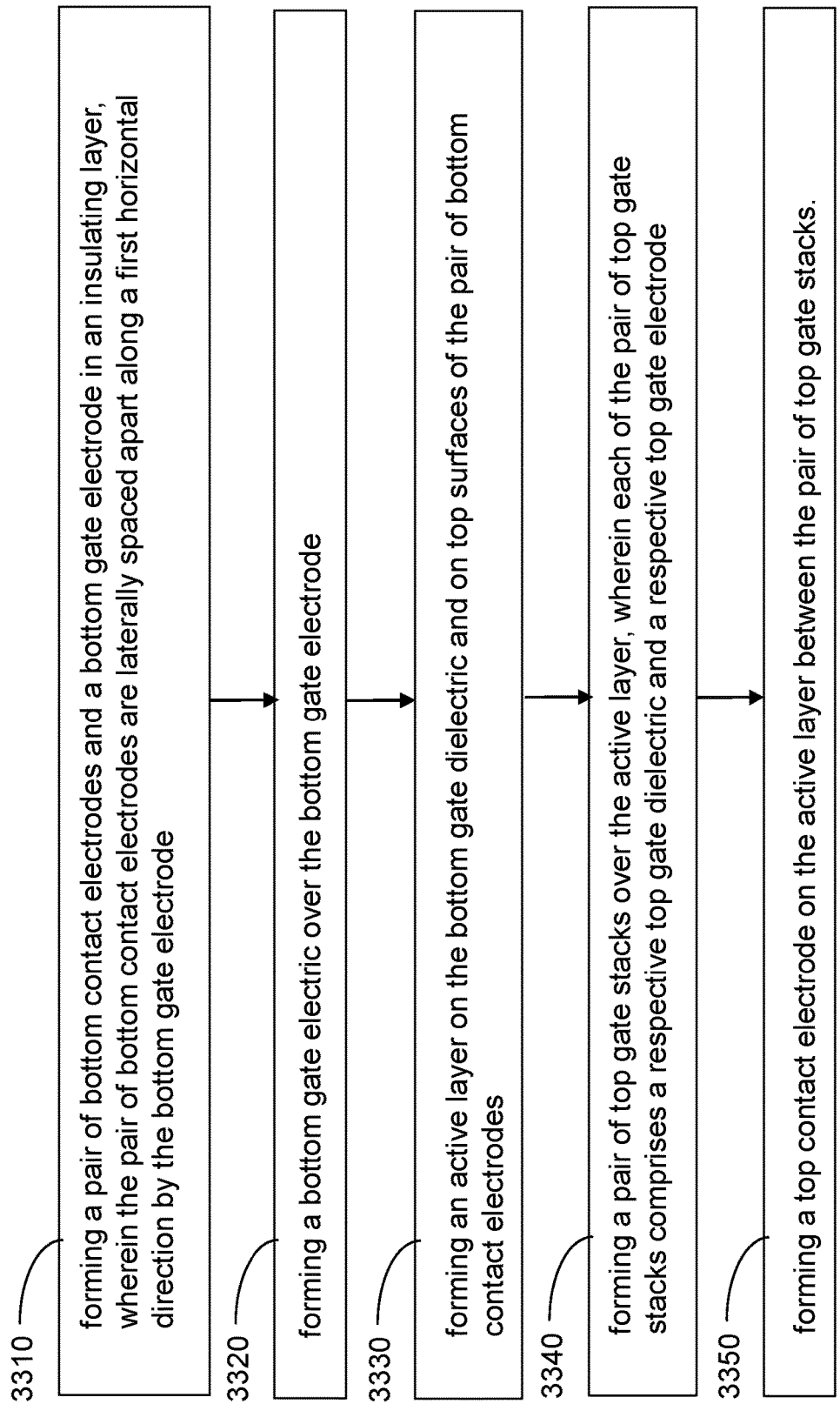
FIG. 33 is a first flowchart that illustrates a first set of processing steps for manufacturing a semiconductor device of the present disclosure.

Referring to FIG. 33, a first flowchart illustrates a first set of processing steps for manufacturing a semiconductor device of the present disclosure, such as the first and second exemplary structures.

Referring to step 3310 and FIGS. 1-5C, a pair of bottom contact electrodes 28 and a bottom gate electrode 15 may be formed in an insulating layer 42. The pair of bottom contact electrodes 28 are laterally spaced apart along a first horizontal direction hd1 from the bottom gate electrode 15.

Referring to step 3320 and FIGS. 6A-7C, a bottom gate dielectric 10 may be formed over the bottom gate electrode 15.

Referring to step 3330 and FIGS. 8A-8C, an active layer 20 may be formed on the bottom gate dielectric 10 and on top surfaces of the pair of bottom contact electrodes 28.

Referring to step 3340 and FIGS. 9A-9C, a pair of top gate stacks (30, 35) may be formed over the active layer 20. Each of the pair of top gate stacks (30, 35) comprises a respective top gate dielectric 30 and a respective top gate electrode 35.

Referring to step 3350 and FIGS. 10A-17C, a top contact electrode 58 may be formed on the active layer 20 between the pair of top gate stacks (30, 35).

Figure 34:
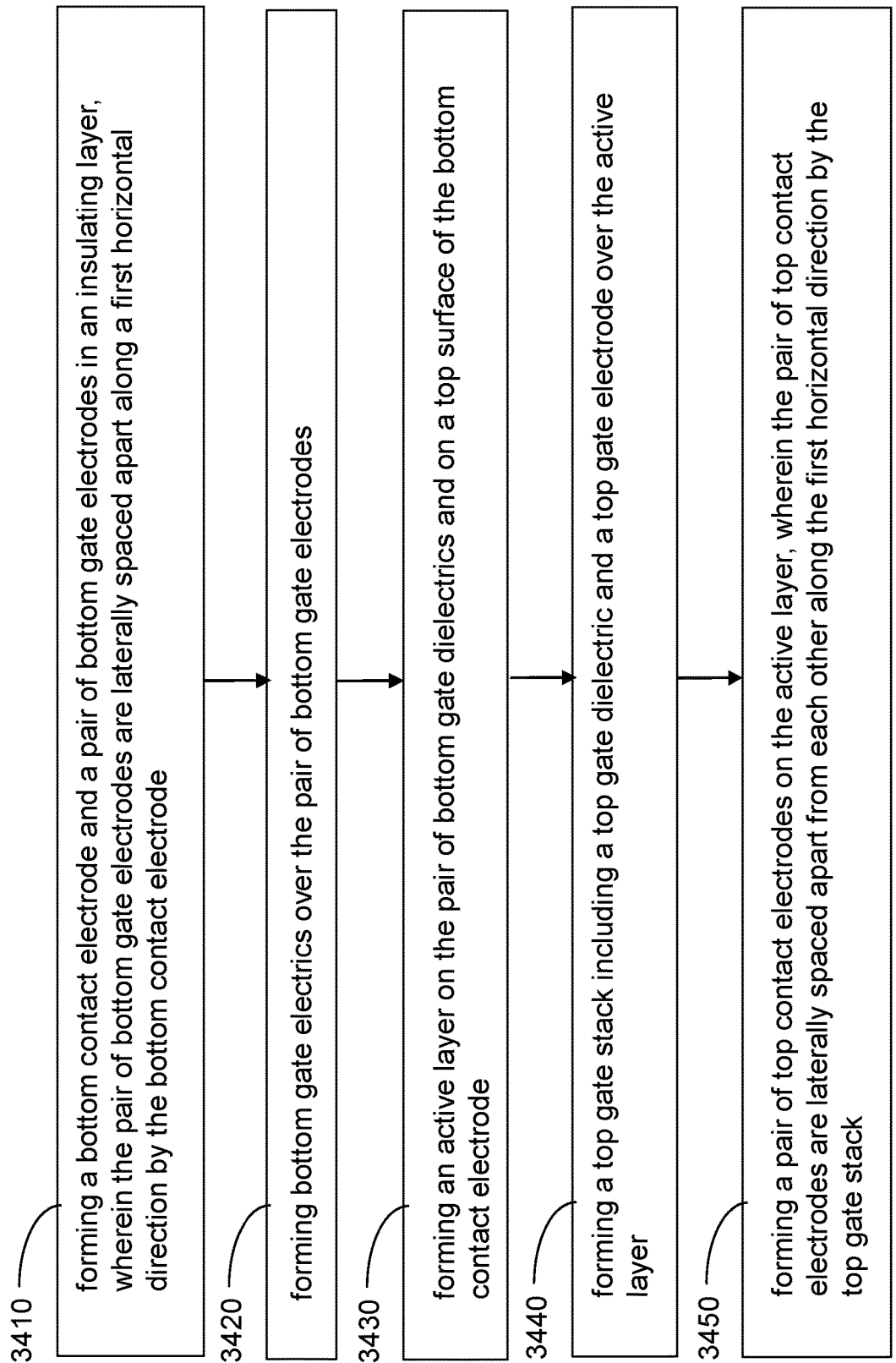
FIG. 34 is a second flowchart that illustrates a second set of processing steps for manufacturing a semiconductor device of the present disclosure.

Referring to FIG. 34, a second flowchart illustrates a second set of processing steps for manufacturing a semiconductor device of the present disclosure, such as the third and fourth exemplary structures.

Referring to step 3410 and FIGS. 1, 2A-2C, and 18A-18C, a bottom contact electrode 28 and a pair of bottom gate electrodes 15 may be formed in an insulating layer 42. The pair of bottom gate electrodes 15 are laterally spaced apart along a first horizontal direction hd1 from the bottom contact electrode 28.

Referring to step 3420 and FIGS. 19A-20C, bottom gate dielectrics 10 may be formed over the pair of bottom gate electrodes 15.

Referring to step 3430 and FIGS. 21A-21C, an active layer 20 may be formed on the pair of bottom gate dielectrics 10 and on a top surface of the bottom contact electrode 28.

Referring to step 3440 and FIGS. 22A-22C, a top gate stack (30, 35) including a top gate dielectric 30 and a top gate electrode 35 may be formed over the active layer 20.

Referring to step 3450 and FIGS. 23A-30C, a pair of top contact electrodes 58 may be formed on the active layer 20. The pair of top contact electrodes 58 are laterally spaced apart from each other along the first horizontal direction hd1 by the top gate stack (30, 35).

Referring to all drawings and according to various embodiments of the present disclosure, a device comprising a thin film transistor is provided. The thin film transistor includes: an active layer 20 located over a substrate 8; a first gate stack {(10, 15) or (30, 35)} including a stack of a first gate dielectric (10 or 30) and a first gate electrode (15 or 35) and located on a center portion of a first surface (such as a bottom surface in the first and second exemplary structures or a top surface in the third and fourth exemplary structures) of the active layer 20; a pair of first contact electrodes (28 or 58) contacting peripheral portions of the first surface of the active layer 20 and laterally spaced from each other along a first horizontal direction hd1 by the first gate electrode (15 or 35); a second contact electrode (58 or 28) contacting a center portion of a second surface (such as a top surface in the first and second exemplary structures or a bottom surface in the third and fourth exemplary structures) of the active layer 20 that is vertically spaced from the first surface of the active layer 20; and a pair of second gate stacks {(30, 35) or (10, 15)} including a respective stack of a second gate dielectric (30 or 10) and a second gate electrode (35 or 15) and located on a respective peripheral portion of a second surface of the active layer 20 and laterally spaced from each other along the first horizontal direction hd1 by the second contact electrode (58 or 28).

In one embodiment, the second contact electrode (58 or 28) has an areal overlap with the first gate stack {(10, 15) or (30, 35)} in a plan view along a direction that is perpendicular to a top surface of the substrate 8; and the first gate electrode (15 or 35) has a greater lateral extent along the first horizontal direction hd1 than the second contact electrode (58 or 28).

In one embodiment, each of the pair of second gate electrodes (35 or 15) has an areal overlap with a respective peripheral portion of the first gate electrode (15 or 35) in a plan view along a direction that is perpendicular to a top surface of the substrate 8.

In one embodiment, each of the pair of first contact electrodes (28 or 58) has an areal overlap with a respective one of the pair of second gate electrodes (35 or 15) in a plan view along a direction that is perpendicular to a top surface of the substrate 8.

In one embodiment, the first surface of the active layer 20 is a bottom surface of the active layer 20 (for example, as in the first and second exemplary structures); and the first gate dielectric 10 contacts each of first contact electrodes 28.

In one embodiment, a bottom surface of the first gate dielectric 10 is located below a horizontal plane including interfaces between the pair of first contact electrodes 28 and the active layer 20; and the first gate dielectric 10 contacts a respective sidewall of each of the pair of first contact electrodes 28.

In one embodiment, a bottom surface of the first gate dielectric 10 is located within a horizontal plane including interfaces between the pair of first contact electrodes 28 and the active layer 20; and the bottom surface of the first gate dielectric 10 contacts a respective top surface of each of the pair of first contact electrodes 28.

In one embodiment, within each stack of the second gate dielectric 30 and the second gate electrode 35, the second gate dielectric 30 has a same lateral extent as the second gate electrode 35 in a plan view along a direction that is perpendicular to a top surface of the substrate 8.

In one embodiment, the second surface of the active layer 20 is a bottom surface of the active layer 20 (for example, as in the third and fourth exemplary structures); and each of the second gate dielectrics 10 contacts the second contact electrode 28.

In one embodiment, each of the second gate dielectrics 10 has a respective bottom surface that is located below a horizontal plane including an interface between second contact electrode 28 and the active layer 20; and each of the second gate dielectrics 10 contacts a respective sidewall of the second contact electrode 28.

In one embodiment, each of the second gate dielectrics 10 has a respective bottom surface that is located within a horizontal plane including an interface between second contact electrode 28 and the active layer 20; and each of the second gate dielectrics 10 contacts a respective portion of a top surface of the second contact electrode 28.

In one embodiment, the first gate dielectric 30 has a same lateral extent as the first gate electrode 35 in a plan view along a direction that is perpendicular to a top surface of the substrate 8.

In one embodiment, the thin film transistor has a feature selected from: a first feature that the pair of first contact electrodes (28 or 58) are source electrodes and the second contact electrode (58 or 28) is a drain electrode; and a second feature that the pair of first contact electrodes (28 or 58) are drain electrodes and the second contact electrode (58 or 28) is a source electrode.

In one embodiment, the device comprises a memory element (such as a memory cell 150) electrically connected to the second contact electrode (58 or 28), wherein the memory element is configurated to be activated upon application of a first activation signal to the first gate electrode (15 or 35) and at least one second activation signal to any of the pair of second gate electrodes (35 or 15).

The various embodiments of the present disclosure provide a tri-gate field effect transistor including three gate electrodes, i.e., a first gate electrode and a pair of second gate electrodes. The first gate electrode and the pair of second gate electrodes are provided on opposite surfaces of an active layer so that electrical current may be controlled for four channels, which include two channels located in proximity to the first gate electrode and to either side of the first gate electrode, and two channels located in proximity to the pair of second gate electrodes on either side of the first contact electrode. The field effect transistor of the present disclosure is conductive to an "OR" type operation in which the electrical current between the first contact electrode and a pair of second contact electrodes may be activated by activation of either of the pair of second gate electrodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
an active layer located over a substrate;
a first gate stack including a stack of a first gate dielectric and a first gate electrode and located on a first surface of the active layer;
a pair of first contact electrodes contacting peripheral portions of the first surface of the active layer and laterally spaced from each other along a first horizontal direction by the first gate electrode;
a second contact electrode contacting a second surface of the active layer that is vertically spaced from the first surface of the active layer; and
a pair of second gate stacks including a respective stack of a second gate dielectric and a second gate electrode and located on a respective peripheral portion of a second surface of the active layer and laterally spaced from each other along the first horizontal direction by the second contact electrode.

2. The semiconductor structure of claim 1, wherein:
the second contact electrode has an areal overlap with the first gate stack in a plan view along a direction that is perpendicular to a top surface of the substrate; and
the first gate electrode has a greater lateral extent along the first horizontal direction than the second contact electrode.

3. The semiconductor structure of claim 1, wherein each of the pair of second gate electrodes has an areal overlap with a respective peripheral portion of the first gate electrode in a plan view along a direction that is perpendicular to a top surface of the substrate.

4. The semiconductor structure of claim 1, wherein each of the pair of first contact electrodes has an areal overlap with a respective one of the pair of second gate electrodes in a plan view along a direction that is perpendicular to a top surface of the substrate.

5. The semiconductor structure of claim 1, wherein:
the first surface of the active layer is a bottom surface of the active layer; and
the first gate dielectric contacts each of first contact electrodes.

6. The semiconductor structure of claim 5, wherein:
a bottom surface of the first gate dielectric is located below a horizontal plane including interfaces between the pair of first contact electrodes and the active layer; and
the first gate dielectric contacts a respective sidewall of each of the pair of first contact electrodes.

7. The semiconductor structure of claim 5, wherein:
a bottom surface of the first gate dielectric is located within a horizontal plane including interfaces between the pair of first contact electrodes and the active layer; and
the bottom surface of the first gate dielectric contacts a respective top surface of each of the pair of first contact electrodes.

8. The semiconductor structure of claim 5, wherein, within each stack of the second gate dielectric and the second gate electrode, the second gate dielectric has a same lateral extent as the second gate electrode in a plan view along a direction that is perpendicular to a top surface of the substrate.

9. The semiconductor structure of claim 1, wherein:
the second surface of the active layer is a bottom surface of the active layer; and
each of the second gate dielectrics contacts the second contact electrode.

10. The semiconductor structure of claim 9, wherein:
each of the second gate dielectrics has a respective bottom surface that is located below a horizontal plane including an interface between second contact electrode and the active layer; and
each of the second gate dielectrics contacts a respective sidewall of the second contact electrode.

11. The semiconductor structure of claim 9, wherein:
each of the second gate dielectrics has a respective bottom surface that is located within a horizontal plane including an interface between second contact electrode and the active layer; and
each of the second gate dielectrics contacts a respective portion of a top surface of the second contact electrode.

12. The semiconductor structure of claim 9, wherein the first gate dielectric has a same lateral extent as the first gate electrode in a plan view along a direction that is perpendicular to a top surface of the substrate.

13. The semiconductor structure of claim 1, wherein the thin film transistor has a feature selected from:
a first feature that the pair of first contact electrodes are source electrodes and the second contact electrode is a drain electrode; and
a second feature that the pair of first contact electrodes are drain electrodes and the second contact electrode is a source electrode.

14. The semiconductor structure of claim 1, further comprising a memory element electrically connected to the second contact electrode, wherein the memory element is configured to be activated upon application of a first activation signal to the first gate electrode and at least one second activation signal to any of the pair of second gate electrodes.

15. A semiconductor structure comprising:
an active layer located over a substrate;
a first gate stack including a stack of a first gate dielectric and a first gate electrode and located on a first surface of the active layer;
a pair of first contact electrodes contacting peripheral portions of the first surface of the active layer and laterally spaced from each other along a first horizontal direction by the first gate electrode;
a second contact electrode contacting a second surface of the active layer that is vertically spaced from the first surface of the active layer; and
a pair of second gate stacks including a respective stack of a second gate dielectric and a second gate electrode and located on a respective peripheral portion of a second surface of the active layer and laterally spaced from each other along the first horizontal direction by the second contact electrode,
wherein:
one of the first surface of the active layer and the second surface of the active layer is a top surface of the active layer; and
another of the first surface of the active layer and the second surface of the active layer is a bottom surface of the active layer.

16. The semiconductor structure of claim 15, wherein the second contact electrode has an areal overlap with the first gate stack in a plan view.

17. The semiconductor structure of claim 15, wherein an interface between the active layer and the first gate stack comprises:
at least two horizontal surface segments located in a first horizontal plane; and
at least one second horizontal surface segment located in a second horizontal plane that is vertically offset from the first horizontal plane.

18. The semiconductor structure of claim 17, wherein the at least two horizontal surface segments are connected to the at least one second horizontal surface segment by at least two tapered surface segments of the active layer that laterally extend along a horizontal direction that is perpendicular to a lateral separation direction between the pair of second gate stacks.

19. A semiconductor structure comprising:
an active layer located over a substrate;
a first gate stack including a stack of a first gate dielectric and a first gate electrode and located on a first surface of the active layer;
a pair of first contact electrodes contacting peripheral portions of the first surface of the active layer and laterally spaced from each other along a first horizontal direction by the first gate electrode;
a second contact electrode contacting a second surface of the active layer that is vertically spaced from the first surface of the active layer; and
a pair of second gate stacks including a respective stack of a second gate dielectric and a second gate electrode and located on a respective peripheral portion of a second surface of the active layer and laterally spaced from each other along the first horizontal direction by the second contact electrode, wherein:
a top surface of the active layer comprises at least two first horizontal top surface segments that are vertically offset from at least one second horizontal top surface segment; and
a bottom surface of the active layer comprises at least two first horizontal bottom surface segments that are vertically offset from at least one second horizontal bottom surface segment.

20. The semiconductor structure of claim 19, wherein the at least two first horizontal top surface segments are connected to the at least one second horizontal top surface segment by tapered surface segments at edges that laterally extend along a horizontal direction that is perpendicular to a lateral separation direction between the pair of second gate stacks.

* * * * *